United States Patent
Nishimura et al.

(10) Patent No.: US 7,736,942 B2
(45) Date of Patent: Jun. 15, 2010

(54) SUBSTRATE PROCESSING APPARATUS, SUBSTRATE PROCESSING METHOD AND STORAGE MEDIUM

(75) Inventors: Eiichi Nishimura, Nirasaki (JP); Takamichi Kikuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/191,041

(22) Filed: Aug. 13, 2008

(65) Prior Publication Data
US 2008/0305632 A1    Dec. 11, 2008

Related U.S. Application Data

(63) Continuation of application No. PCT/JP2007/052792, filed on Feb. 9, 2007.

(30) Foreign Application Priority Data
Feb. 13, 2006    (JP)    ............... 2006-035550

(51) Int. Cl.
*H01L 51/40* (2006.01)

(52) U.S. Cl. .................. 438/99; 438/422; 438/758; 438/780; 257/E21.271; 257/E21.278

(58) Field of Classification Search ............. 438/214, 438/318, 319, 422, 473; 257/E21.254
See application file for complete search history.

(56) References Cited

U.S. PATENT DOCUMENTS

| 6,093,583 A * | 7/2000 | Mukerji et al. ............... 438/113 |
| 2002/0094691 A1 | 7/2002 | Yokogawa et al. |
| 2004/0185670 A1 | 9/2004 | Hamelin et al. |
| 2004/0262254 A1 | 12/2004 | Ozawa et al. |

FOREIGN PATENT DOCUMENTS

| JP | 02-201916 A | 8/1990 |
| JP | 2002-217169 A | 8/2002 |
| JP | 2005-39185 A | 2/2005 |

* cited by examiner

*Primary Examiner*—Charles D Garber
*Assistant Examiner*—Cheung Lee
(74) *Attorney, Agent, or Firm*—Oblon, Spivak, McClelland, Maier & Neustadt, L.L.P.

(57) ABSTRACT

A substrate processing apparatus is provided to enable to efficiently remove an oxide layer and an organic material layer. A third process unit (36) of a substrate processing apparatus (10) includes a box-shaped process vessel (chamber) (50), a nitrogen gas supply system (190) and an ozone gas supply system (191). The ozone gas supply system (191) includes an ozone gas supply unit (195) and an ozone gas supply pipe (196) connected to the ozone gas supply unit (195). The ozone gas supply pipe (196) has an ozone gas supply hole (197) having an opening arranged opposite to a wafer (W). The ozone gas supply unit (195) supplies an ozone ($O_3$) gas into the chamber (50) through the ozone gas supply hole (197) via the ozone gas supply pipe (196).

20 Claims, 12 Drawing Sheets

SUBSTRATE PROCESSING APPARATUS, SUBSTRATE PROCESSING METHOD AND STORAGE MEDIUM

This application is a Continuation Application of PCT International Application No. PCT/JP2007/052792 filed on Feb. 9, 2007, which designated the United States.

FIELD OF THE INVENTION

The present invention relates to a substrate processing apparatus, a substrate processing method and a storage medium; and, more particularly, to a substrate processing apparatus and a substrate processing method for removing an organic material layer.

BACKGROUND OF THE INVENTION

In a method of fabricating electronic devices from a silicon wafer (hereinafter referred to simply as a "wafer"), a film formation step of forming a conductive film or an insulating film on a surface of the wafer by using CVD (chemical vapor deposition) or the like, a lithography step of forming a photoresist layer in a desired pattern on the formed conductive film or insulating film, and an etching step of forming the conductive film into gate electrodes, or forming wiring grooves or contact holes in the insulating film, by using a plasma produced from processing gas while using the photoresist layer as a mask are repeatedly implemented in that order.

For example, in one electronic device manufacturing method, floating gates formed of a SiN (silicon nitride) layer and a polysilicon layer formed on a wafer are etched by using HBr (hydrogen bromide)-based processing gas, an interlayer $SiO_2$ film below the floating gates is etched by using $CHF_3$-based processing gas, and then a Si layer below the interlayer $SiO_2$ film is etched by using HBr (hydrogen bromide)-based processing gas. In this case, a deposit film 181 made of three layers is formed on side surfaces of trenches (grooves) 180 formed on the wafer (see FIG. 12). The deposit film is made of a SiOBr layer 182, a CF-based deposit layer 183 and a SiOBr layer 184 corresponding to the respective processing gases. The SiOBr layers 182 and 184 are pseudo-$SiO_2$ layers having properties similar to those of a $SiO_2$ layer, and the CF-based deposit layer 183 is an organic material layer.

The SiOBr layers 182 and 184 and the CF-based deposit layer 183 cause problems for the electronic devices such as conduction failures and hence need to be removed.

As a pseudo-$SiO_2$ layer removal method, there is known a substrate processing method in which a wafer is subjected to COR processing (chemical oxide removal) and PHT processing (post heat treatment). The COR processing is a processing in which the pseudo-$SiO_2$ layer is made to undergo chemical reaction with gas molecules to produce a product, and the PHT processing is a processing in which the wafer that has been subjected to the COR processing is heated so as to vaporize and thermally oxidize the product that has been produced on the wafer through the chemical reaction in the COR processing, thereby removing the product from the wafer.

As a substrate processing apparatus for implementing the substrate processing method including COR processing and PHT processing, there is known a substrate processing apparatus having a chemical reaction processing unit and a heat treatment unit connected to the chemical reaction processing unit. The chemical reaction processing unit has a chamber, and carries out the COR processing on a wafer accommodated in the chamber. The heat treatment unit also has a chamber, and carries out the PHT processing on a wafer accommodated in the chamber (see, e.g., specification of U.S. Patent Application Publication No. 2004/0185670).

However, with removing the SiOBr layer 184 as a pseudo-$SiO_2$ layer by using the above substrate processing apparatus, the CF-based deposit layer 183 is exposed. The CF-based deposit layer 183 is not vaporized even upon carrying out the heat treatment, and does not undergo chemical reaction with the gas molecules to produce a product. Therefore, it is difficult to remove the CF-based deposit layer 183 by using the above substrate processing apparatus. That is, it is difficult to efficiently remove the SiOBr layer 184 and the CF-based deposit layer 183.

SUMMARY OF THE INVENTION

In view of the above, the present invention provides a substrate processing apparatus and method capable of removing an oxide layer and an organic material layer efficiently and a storage medium.

In accordance with a first aspect of the invention, there is provided a substrate processing apparatus for performing processing on a substrate having on a surface thereof an organic material layer covered with an oxide layer, the substrate processing apparatus including: a chemical reaction processing unit for subjecting the oxide layer to chemical reaction with gas molecules so as to produce a product on the surface of the substrate; and a heat treatment unit for heating the substrate on the surface of which the product has been produced; wherein the heat treatment unit includes: a chamber for accommodating the substrate; and an ozone gas supply system for supplying ozone gas into the chamber.

The substrate processing apparatus of the first aspect, wherein the ozone gas supply system may have an ozone gas supply hole having an opening provided opposite to the substrate accommodated in the chamber.

The substrate processing apparatus of the first aspect, wherein the organic material layer may be a layer made of CF-based deposit.

In accordance with a second aspect of the invention, there is provided a substrate processing apparatus for performing processing on a substrate having on a surface thereof an organic material layer covered with an oxide layer, the substrate processing apparatus including: a chemical reaction processing unit for subjecting the oxide layer to chemical reaction with gas molecules so as to produce a product on the surface of the substrate; and a heat treatment unit for heating the substrate on the surface of which the product has been produced; wherein the heat treatment unit includes: a chamber for accommodating the substrate; and an oxygen radical supply system for supplying oxygen radicals into the chamber.

The substrate processing apparatus of the second aspect, wherein the oxygen radical supply system may have an oxygen radical supply hole having an opening provided opposite to the substrate accommodated in the chamber.

The substrate processing apparatus of the second aspect, wherein the oxygen radical supply system may include an ozone gas supply unit for supplying ozone gas into the chamber and an ozone gas heating unit for thermally decomposing the ozone gas.

The substrate processing apparatus of the second aspect, wherein the organic material layer may be a layer made of CF-based deposit.

In accordance with a third aspect of the invention, there is provided a substrate processing method for performing processing on a substrate having on a surface thereof an organic material layer covered with an oxide layer, the substrate processing method including: a chemical reaction processing step of subjecting the oxide layer to chemical reaction with gas molecules so as to produce a product on the surface of the substrate; a heat treatment step of heating the substrate on the surface of which the product has been produced; and an ozone gas supply step of supplying ozone gas to the surface of the substrate on which the heat treatment has been carried out.

In accordance with a fourth aspect of the invention, there is provided a substrate processing method for performing processing on a substrate having on a surface thereof an organic material layer covered with an oxide layer, the substrate processing method including: a chemical reaction processing step of subjecting the oxide layer to chemical reaction with gas molecules so as to produce a product on the surface of the substrate; a heat treatment step of heating the substrate on the surface of which the product has been produced; and an oxygen radical supply step of supplying oxygen radicals to the surface of the substrate on which the heat treatment has been carried out.

In accordance with a fifth aspect of the invention, there is provided a computer-readable storage medium storing a program for causing a computer to implement a substrate processing method for performing processing on a substrate having on a surface thereof an organic material layer covered with an oxide layer, wherein the program includes: a chemical reaction processing module for subjecting the oxide layer to chemical reaction with gas molecules so as to produce a product on the surface of the substrate; a heat treatment module for heating the substrate on the surface of which the product has been produced; and an ozone gas supply module for supplying ozone gas to the surface of the substrate on which the heat treatment has been carried out.

In accordance with a sixth aspect of the invention, there is provided a computer-readable storage medium storing a program for causing a computer to implement a substrate processing method for performing processing on a substrate having on a surface thereof an organic material layer covered with an oxide layer, wherein the program includes: a chemical reaction processing module for subjecting the oxide layer to chemical reaction with gas molecules so as to produce a product on the surface of the substrate; a heat treatment module for heating the substrate on the surface of which the product has been produced; and an oxygen radical supply module for supplying oxygen radicals to the surface of the substrate on which the heat treatment has been carried out.

BRIEF DESCRIPTION OF THE DRAWINGS

FIGS. 2A and 2B provide cross sectional views of a second processing unit shown in FIG. 1; wherein FIG. 2A is a cross sectional view taken along line II-II in FIG. 1, and FIG. 2B is an enlarged view of a portion A illustrated in FIG. 2A;

DETAILED DESCRIPTION OF THE EMBODIMENT

The embodiments of the present invention will be described with reference to the accompanying drawings.

First of all, a substrate processing apparatus in accordance with a first embodiment of the present invention will be described.

Figure 1:
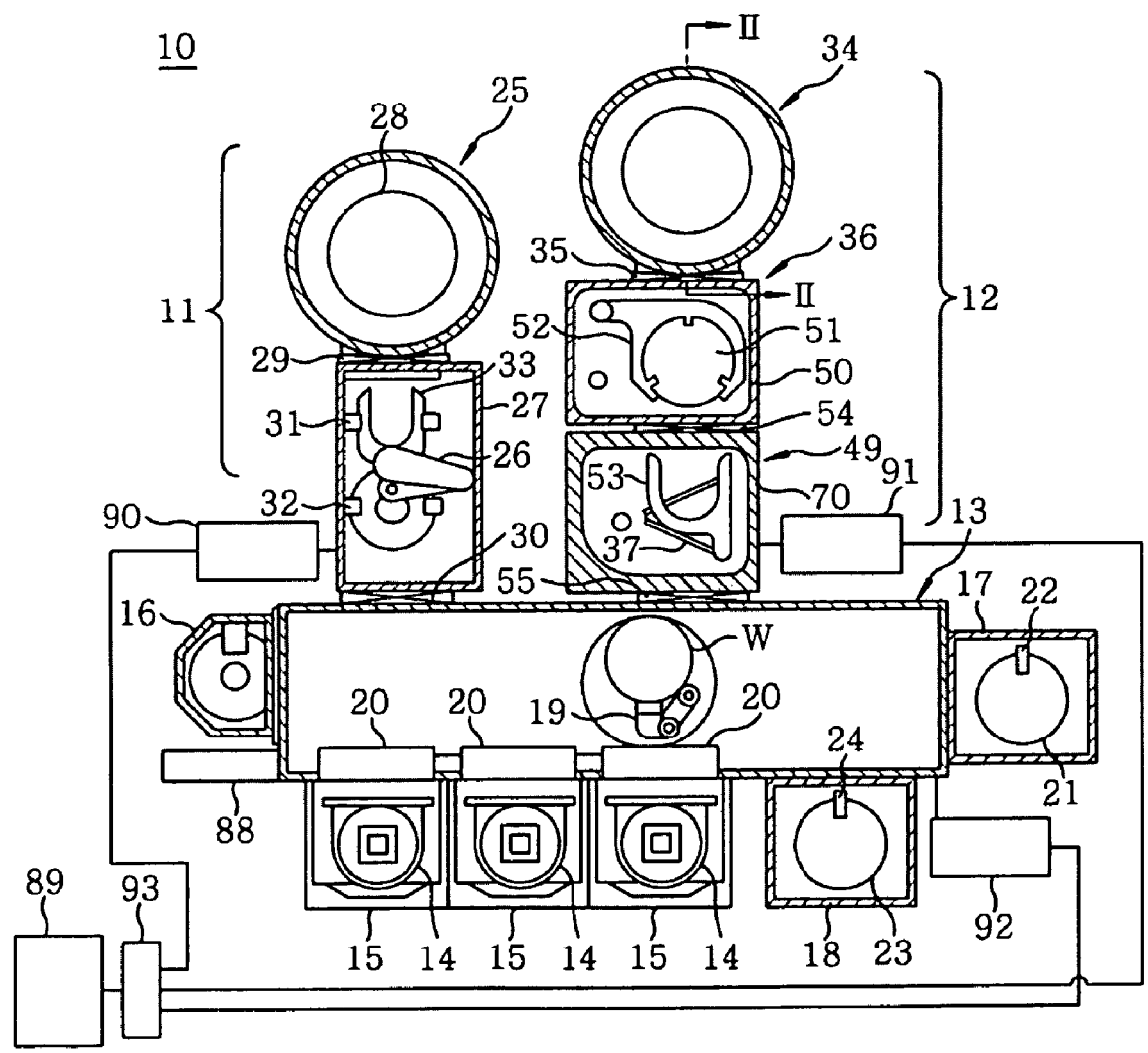
FIG. 1 is a top view schematically showing a configuration of a substrate processing apparatus in accordance with a first embodiment of the present invention.

FIG. 1 is a top view schematically showing a configuration of the substrate processing apparatus in accordance with the present embodiment. As shown in FIG. 1, the substrate processing apparatus 10 includes: a first process ship 11 for carrying out etching on electronic device wafers (hereinafter referred to simply as "wafers") (substrates) W; a second process ship 12 disposed parallel to the first process ship 11, for carrying out COR processing, PHT processing, and organic material layer removal processing, which will be described later, on the wafers W on which the etching has been carried out in the first process ship 11; and a loader unit 13 as a rectangular common transfer chamber to which each of the first process ship 11 and the second process ship 12 is connected.

In addition to the first process ship 11 and the second process ship 12, connected to the loader unit 13 are three FOUP mounting tables 15 each mounted with a FOUP (front opening unified pod) 14, which is a container for accommodating twenty-five wafers W, an orienter 16 for carrying out pre-alignment of the position of each wafer W unloaded from a FOUP 14, and first and second IMS's (Integrated Metrology Systems, made by Therma-Wave, Inc.) 17 and 18 for measuring the surface state of each wafer W.

The first and the second process ship 11 and 12 are connected to a side wall of the loader unit 13 in a longitudinal direction of the loader unit 13, and also are disposed opposite to the three FOUP mounting tables 15 with the loader unit 13 therebetween. The orienter 16 is disposed at one end of the loader unit 13 in the longitudinal direction of the loader unit 13. The first IMS 17 is disposed at the other end of the loader unit 13 in the longitudinal direction of the loader unit 13. The second IMS 18 is disposed alongside the three FOUP mounting tables 15.

A scalar dual-arm type transfer arm mechanism 19 for transferring the wafers W is disposed inside the loader unit 13, and three loading ports 20 through which the wafers W are introduced into the loader unit 13 are disposed on a side wall of the loader unit 13 in correspondence with the FOUP mounting tables 15. The transfer arm mechanism 19 unloads a wafer W from a FOUP 14 mounted on a FOUP mounting tables 15 through the corresponding loading port 20, and transfers the unloaded wafer W into and out of the first process ship 11, the second process ship 12, the orienter 16, the first IMS 17, and the second IMS 18.

The first IMS 17 is an optical monitor having a mounting table 21 for mounting thereon a loaded wafer W and an optical sensor 22 that is directed to the wafer W mounted on the mounting table 21. The first IMS 17 measures the surface shape of the wafer W, e.g., a thickness of a surface layer, and CD (critical dimension) values of wiring grooves, gate electrodes and the like. Like the first IMS 17, the second IMS 18 is also an optical monitor, and has a mounting table 23 and an optical sensor 24. The second IMS 18 measures the number of particles on the surface of each wafer W.

The first process ship 11 has a first processing unit 25 for performing etching on each wafer W, and a first load lock unit 27 containing a first transfer arm 26 of a link-shaped single pick type for transferring each wafer W into and out of the first processing unit 25.

The first processing unit 25 has a cylindrical processing chamber (chamber), and an upper electrode and a lower electrode are disposed in the chamber. A distance between the upper electrode and the lower electrode is set to an specified value appropriate for carrying out the etching on each wafer W. Further, the lower electrode has in a top portion thereof an ESC (electrostatic chuck) 28 for electrostatically attracting and holding the wafer W thereto by using a Coulomb force or the like.

In the first processing unit 25, a processing gas is introduced into the chamber, and an electric field is generated between the upper electrode and the lower electrode. Accordingly, the introduced processing gas is turned into a plasma so as to produce ions and radicals. The wafer W is etched by the ions and radicals.

In the first process ship 11, the internal pressure of the first processing unit 25 is held at vacuum, whereas the internal pressure of the loader unit 13 is held at the atmospheric pressure. Thus, the first load lock unit 27 is provided with a vacuum gate valve 29 in a connecting part between the first load lock unit 27 and the first processing unit 25, and an atmospheric gate valve 30 in a connecting part between the first load lock unit 27 and the loader unit 13. As a consequence, the first load lock unit 27 is constructed as a preliminary vacuum transfer chamber whose internal pressure can be adjusted.

The first transfer arm 26 is disposed in an approximately central portion of the first load lock unit 27. First buffers 31 are disposed closer to the first processing unit 25 than from the first transfer arm 26, and second buffers 32 are disposed closer to the loader unit 13 than from the first transfer arm 26. The first and the second buffer 31 and 32 are disposed on a track along which a supporting portion (pick) 33 which supports each wafer W moves, the supporting portion 33 being disposed at a distal end of the first transfer arm 26. After having been subjected to the etching, each wafer W is temporarily laid by above the track of the supporting portion 33. Accordingly, exchange of the wafer W that has been subjected to the etching and a wafer W yet to be subjected to the etching can be carried out smoothly in the first processing unit 25.

Figure 2A:
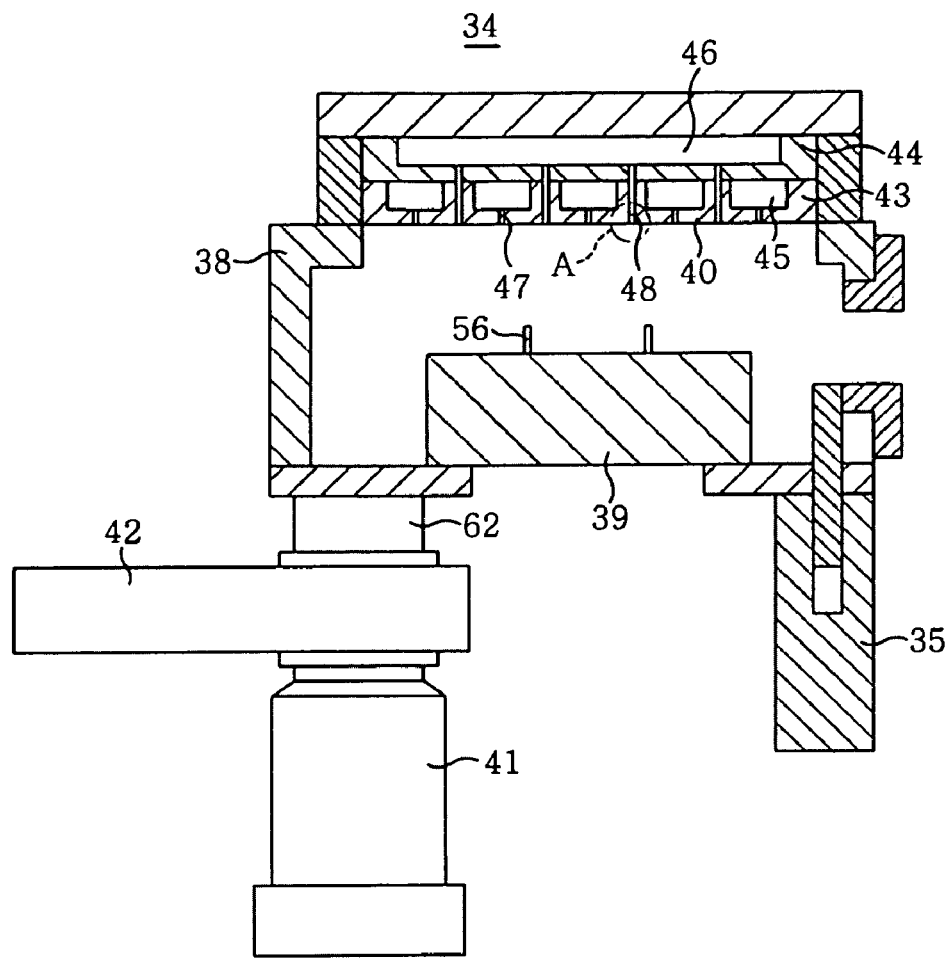
Figure 2B:
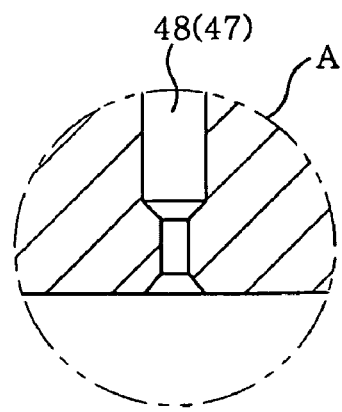

The second process ship 12 has a second processing unit 34 (chemical reaction processing unit) for performing COR processing on each wafer W, a third processing unit 36 (heat treatment unit) for performing PHT processing and organic material layer removal processing on each wafer W, the third processing unit 36 being connected to the second processing unit 34 via a vacuum gate valve 35, and a second load lock unit 49 containing a second transfer arm 37 of a link-shaped single pick type for transferring each wafer W to the third processing unit 36 and the second processing unit 34. FIGS. 2A and 2B are cross sectional views of the second processing unit 34 shown in FIG. 1. Specifically, FIG. 2A is a cross sectional view taken along line II-II in FIG. 1, and FIG. 2B is an enlarged view of a portion A shown in FIG. 2A.

As shown in FIG. 2A, the second processing unit 34 has a cylindrical processing chamber (chamber) 38, an ESC 39 as a wafer W mounting table disposed in the chamber 38, a shower head 40 disposed above the chamber 38, a TMP (turbo molecular pump) 41 for exhausting gas in the chamber 38, and an APC (adaptive pressure control) valve 42 as a variable butterfly valve disposed between the chamber 38 and the TMP 41 for controlling the pressure in the chamber 38.

The ESC 39 has therein an electrode plate (not shown) to which a DC voltage is applied. A wafer W is attracted to and held on the ESC 39 by a Johnsen-Rahbek force or a Coulomb force generated by the DC voltage. Moreover, the ESC 39 has a coolant chamber (not shown) as a temperature adjusting mechanism. A coolant, e.g., cooling water or a Galden fluid, at a predetermined temperature is circulated through the coolant chamber. A processing temperature of the wafer W attracted to and held on an upper surface of the ESC 39 is controlled by the temperature of the coolant. Furthermore, the ESC 39 has a thermally conductive gas supply system (not shown) for supplying thermally conductive gas (helium gas) uniformly between the upper surface of the ESC 39 and a backside of the wafer W. The thermally conductive gas performs heat exchange between the wafer W and the ESC 39, which is maintained at a desired specified temperature by the coolant, during the COR processing, thereby cooling the wafer W efficiently and uniformly.

Moreover, the ESC 39 has a plurality of pusher pins 56 as lifting pins that can be protruded above the upper surface of the ESC 39. The pusher pins 56 are accommodated inside the ESC 39 when a wafer W is attracted to and held on the ESC 39, and are made to be protruded above the upper surface of the ESC 39 so as to lift the wafer W up when the wafer W is to be unloaded from the chamber 38 after having been subjected to the COR processing.

The shower head 40 has a two-layer structure including a lower layer portion 43 and an upper layer portion 44. The lower layer portion 43 has therein first buffer chambers 45, and the upper layer portion 44 has therein a second buffer chamber 46. The first buffer chambers 45 and the second buffer chamber 46 communicate with the interior of the chamber 38 via gas-passing holes 47 and 48, respectively. That is, the shower head 40 is formed of two plate-shaped laminated members (the lower layer portion 43 and the upper layer portion 44) having therein internal channels leading to the chamber 38 which are used for gas supplied into the first buffer chambers 45 and the second buffer chamber 46.

When carrying out the COR processing on a wafer W, $NH_3$ (ammonia) gas is supplied into the first buffer chambers 45 from an ammonia gas supply pipe 57 to be described later, and the supplied ammonia gas is supplied via the gas-passing holes 47 into the chamber 38. At the same time, HF (hydrogen fluoride) gas is supplied into the second buffer chamber 46 from a hydrogen fluoride gas supply pipe 58 to be described below, and the supplied hydrogen fluoride gas is supplied via the gas-passing holes 48 into the chamber 38.

Further, the shower head 40 has a heater (not shown), e.g., a heating element, built therein. The heating element is preferably disposed on the upper layer portion 44 so as to control the temperature of the hydrogen fluoride gas in the second buffer chamber 46.

Besides, as shown in FIG. 2B, a portion of each of the gas-passing holes 47 and 48 where the gas-passing hole 47 or 48 opens out into the chamber 38 is formed so as to widen out toward an end thereof. As a result, the ammonia gas and the hydrogen fluoride gas can be efficiently diffused into the chamber 38. Moreover, each of the gas-passing holes 47 and 48 has a cross-sectional shape having a constriction therein. As a result, any deposit produced in the chamber 38 can be prevented from flowing back into the gas-passing holes 47 and 48, thereby resulting in being prevented from flowing back into the first buffer chambers 45 or the second buffer chamber 46. Alternatively, the gas-passing holes 47 and 48 may each have a spiral shape.

In the second processing unit 34, the COR processing is performed on a wafer W by adjusting the pressure in the chamber 38 and the volumetric flow rate ratio between the ammonia gas and the hydrogen fluoride gas. Further, the second processing unit 34 is designed such that the ammonia gas and the hydrogen fluoride gas are mixed together for the first time in the chamber 38 (post-mixing design) and, hence, the two gases are prevented from mixing together until they are introduced into the chamber 38. Accordingly, the hydrogen fluoride gas and the ammonia gas are prevented from reacting with each other before being introduced into the chamber 38. Furthermore, in the second processing unit 34, a heater (not shown), e.g., a heating element, is built into a side wall of the chamber 38, so that the temperature of the atmosphere in the chamber 38 is prevented from being decreased. As a consequence, the reproducibility of the COR processing can be improved. In addition, the heating element in the side wall controls the temperature of the side wall, so that byproducts formed in the chamber 38 can be prevented from being attached to the inside of the side wall.

Figure 3:
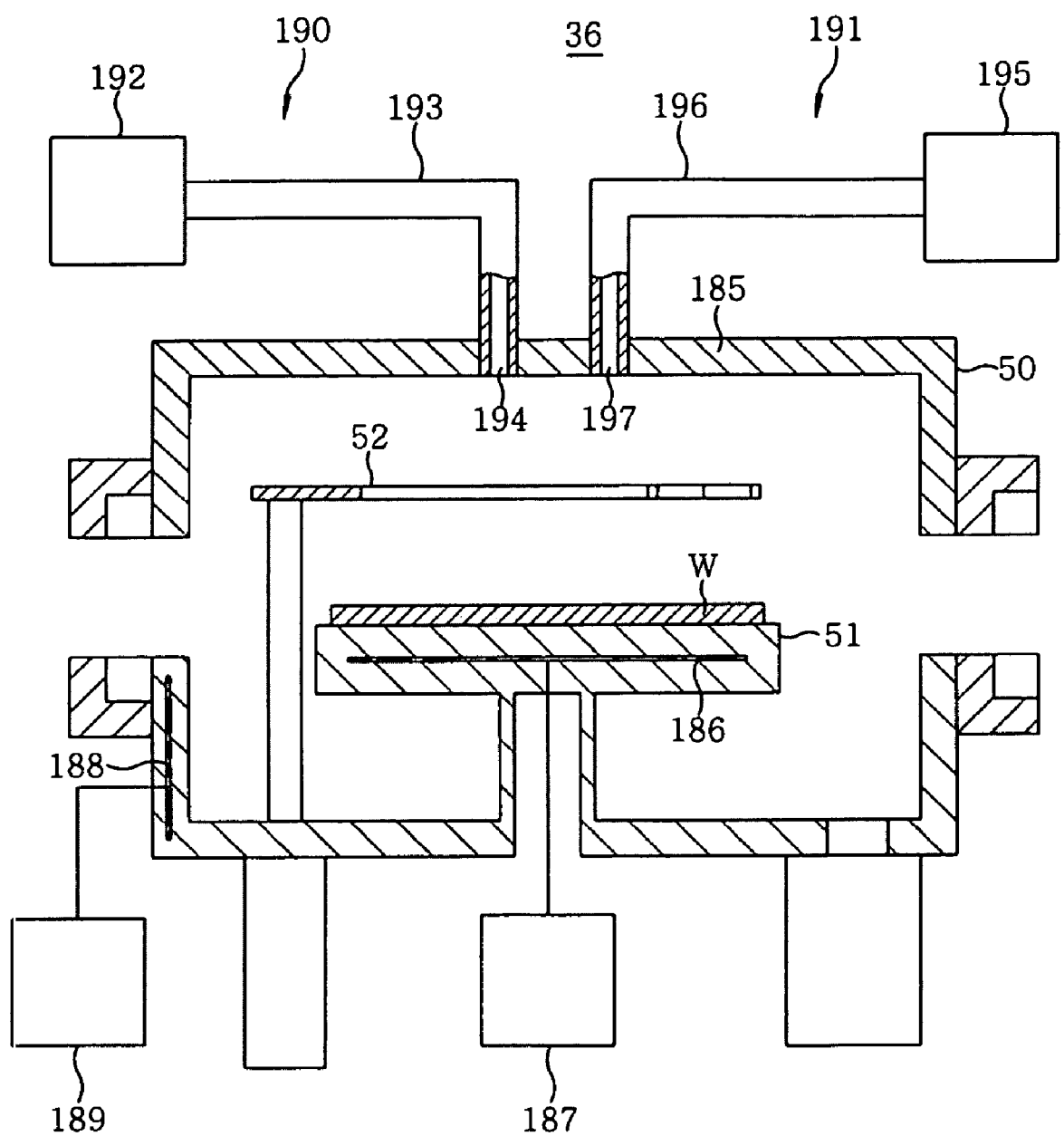
FIG. 3 illustrates a cross sectional view of a third processing unit in FIG. 1.

FIG. 3 is a cross sectional view of the third processing unit 36 shown in FIG. 1.

As shown in FIG. 3, the third processing unit 36 has a box-shaped processing chamber (chamber) 50, a stage heater 51 as a wafer W mounting table disposed in the chamber 50 so as to be disposed opposite to a ceiling portion 185 of the chamber 50, a buffer arm 52 that is disposed in the vicinity of the stage heater 51 and lifts up a wafer W mounted on the stage heater 51, and a PHT chamber lid (not shown) as an openable/closable lid for isolating the interior of the chamber 50 from the external atmosphere.

The stage heater 51 is made of aluminum having an oxide film formed on a surface thereof, and heats the wafer W mounted on an upper surface thereof up to a predetermined temperature by using a heater 186 formed of heating wires or the like built therein. Specifically, the stage heater 51 directly heats the wafer W mounted thereon up to about 100 to 200° C., preferably about 135° C., over at least 1 minute. Further, a heating amount of the heater 186 is controlled by a heater controller 187.

The PHT chamber lid has a sheet heater made of silicone rubber disposed thereon, so that the wafer W is heated from above. Moreover, a cartridge heater 188 is built into a side wall of the chamber 50. The cartridge heater 188 controls the wall surface temperature of the side wall of the chamber 50 to be maintained at a temperature between about 25 and 80° C. Accordingly, by-products are prevented from being attached to the side wall of the chamber 50, and generation of particles due to such attached by-products is also prevented. As a result, the time period between one cleaning and the next of the chamber 50 can be extended. Moreover, an outer periphery of the chamber 50 is covered by a heat shield (not shown), and the heating amount of the cartridge heater 188 is controlled by a heater controller 189.

Instead of the sheet heater described above, a UV (ultraviolet) radiation heater may alternatively be used as the heater for heating the wafer W from above. An example of the UV radiation heater is a UV lamp that emits UV radiation of wavelength 190 to 400 nm.

The buffer arm 52 temporarily retracts each wafer W subjected to the COR processing to a position on a track of a supporting portion 53 of the second transfer arm 37. Consequently, exchange of wafers W in the second processing unit 34 and the third processing unit 36 can be carried out smoothly.

In the third processing unit 36, the PHT processing is performed on each wafer W by controlling the temperature of the wafer W.

Further, the third processing unit 36 includes a nitrogen gas supply system 190 and an ozone gas supply system 191.

The nitrogen gas supply system 190 has a nitrogen gas supply unit 192 and a nitrogen gas supply pipe 193 connected to the nitrogen gas supply unit 192. The nitrogen gas supply pipe 193 has a nitrogen gas supply hole 194 having an opening facing to the wafer W mounted on the stage heater 51 at a ceiling portion of the chamber 50. The nitrogen gas supply unit 192 supplies nitrogen ($N_2$) gas, as purge gas, into the chamber 50 through the nitrogen gas supply hole 194 via the nitrogen gas supply pipe 193. Further, the nitrogen gas supply unit 192 controls the flow rate of the supplied nitrogen gas.

The ozone gas supply system 191 has an ozone gas supply unit 195 and an ozone gas supply pipe 196 connected to the ozone gas supply unit 195. The ozone gas supply pipe 196 has an ozone gas supply hole 197 having an opening facing to the wafer W mounted on the stage heater 51 at the ceiling portion of the chamber 50. The ozone gas supply unit 195 supplies ozone ($O_3$) gas into the chamber 50 through the ozone gas supply hole 197 via the ozone gas supply pipe 196. Further, the ozone gas supply unit 195 controls the flow rate of the supplied ozone gas.

In the third processing unit 36, each wafer W that has been subjected to the PHT processing is subjected to the organic material layer removal processing immediately following the PHT process. Referring to FIG. 1 again, the second load lock unit 49 has a box-shaped transfer chamber (chamber) 70 containing the second transfer arm 37. The internal pressure of each of the second processing unit 34 and the third processing unit 36 is held at vacuum or a pressure below the atmosphere pressure, whereas the internal pressure of the loader unit 13 is held at the atmospheric pressure. Therefore, the second load lock unit 49 is provided with a vacuum gate valve 54 in a connecting part between the second load lock unit 49 and the third processing unit 36, and an atmospheric door valve 55 in a connecting part between the second load lock unit 49 and the loader unit 13. Accordingly, the second load lock unit 49 is constructed as a preliminary vacuum transfer chamber whose internal pressure can be adjusted.

Figure 4:
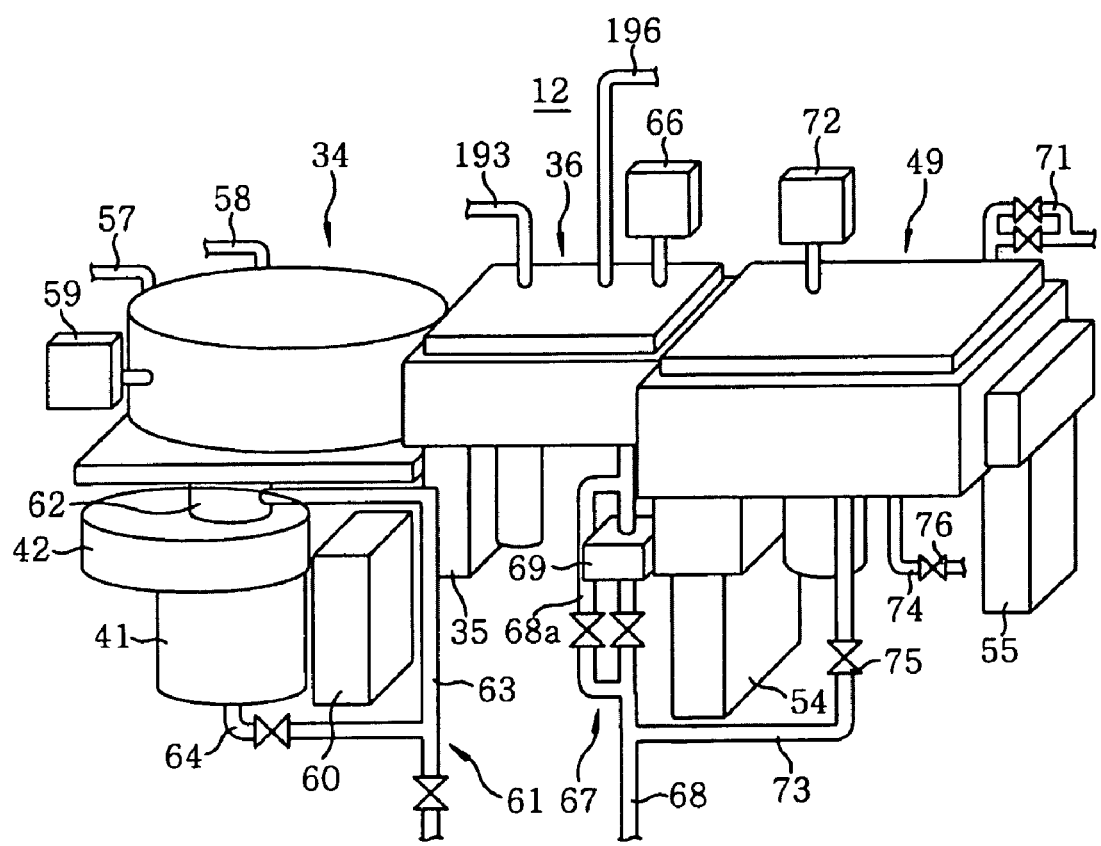
FIG. 4 depicts a perspective view schematically showing a configuration of a second process ship in FIG. 1.

FIG. 4 is a perspective view schematically showing a configuration of the second process ship 12 in FIG. 1.

As shown in FIG. 4, the second processing unit 34 has the ammonia gas supply pipe 57 for supplying ammonia gas into the first buffer chambers 45, the hydrogen fluoride gas supply pipe 58 for supplying hydrogen fluoride gas into the second buffer chamber 46, a pressure gauge 59 for measuring the pressure in the chamber 38, and a chiller unit 60 for supplying a coolant into the cooling system provided in the ESC 39.

The ammonia gas supply pipe 57 has therein an MFC (mass flow controller) (not shown) for adjusting the flow rate of the ammonia gas supplied into the first buffer chambers 45, and the hydrogen fluoride gas supply pipe 58 has therein an MFC (not shown) for adjusting the flow rate of the hydrogen fluoride gas supplied into the second buffer chamber 46. The MFC in the ammonia gas supply pipe 57 and the MFC in the hydrogen fluoride gas supply pipe 58 cooperate together so as to adjust the volumetric flow rate ratio between the ammonia gas and the hydrogen fluoride gas supplied into the chamber 38.

Moreover, a second processing unit exhaust system 61 connected to a DP (dry pump) (not shown) is disposed below the second processing unit 34. The second processing unit exhaust system 61 exhausts gas in the chamber 38, and has an exhaust pipe 63 communicating with an exhaust duct 62 provided between the chamber 38 and the APC valve 42 and an exhaust pipe 64 connected to a lower part (i.e. on the exhaust side) of the TMP 41. Further, the exhaust pipe 64 is connected to the exhaust pipe 63 at an upstream of the DP.

The third processing unit 36 has the nitrogen gas supply system 190, the ozone gas supply system 191, a pressure gauge 66 for measuring the pressure in the chamber 50, and the third processing unit exhaust system 67 for exhausting nitrogen gas or the like in the chamber 50.

The third processing unit exhaust system 67 has a main exhaust pipe 68 that communicates with the chamber 50 and is connected to the DP, the APC valve 69 disposed part way along the main exhaust pipe 68, and an auxiliary exhaust pipe 68a that branches off from the main exhaust pipe 68 so as to circumvent the APC valve 69 and is connected to the main exhaust pipe 68 at an upstream of the DP. The APC valve 69 controls the pressure in the chamber 50.

The second load lock unit 49 has a nitrogen gas supply pipe 71 for supplying nitrogen gas into the chamber 70, a pressure gauge 72 for measuring the pressure in the chamber 70, a second load lock unit exhaust system 73 for exhausting the nitrogen gas in the chamber 70, and an atmosphere communicating pipe 74 for opening the interior of the chamber 70 to the atmosphere.

The nitrogen gas supply pipe 71 has therein an MFC (not shown) for adjusting the flow rate of the nitrogen gas supplied into the chamber 70. The second load lock unit exhaust system 73 is formed of a single exhaust pipe which communicates with the chamber 70 and is connected to the main exhaust pipe 68 of the third processing unit exhaust system 67 at an upstream of the DP. Moreover, the second load lock unit exhaust system 73 has therein an openable/closable exhaust valve 75, and the atmosphere communicating pipe 74 has therein an openable/closable relief valve 76. The exhaust valve 75 and the relief valve 76 cooperate together so as to adjust the pressure in the chamber 70 to any pressure from the atmospheric pressure to a desired degree of vacuum.

Figure 5:
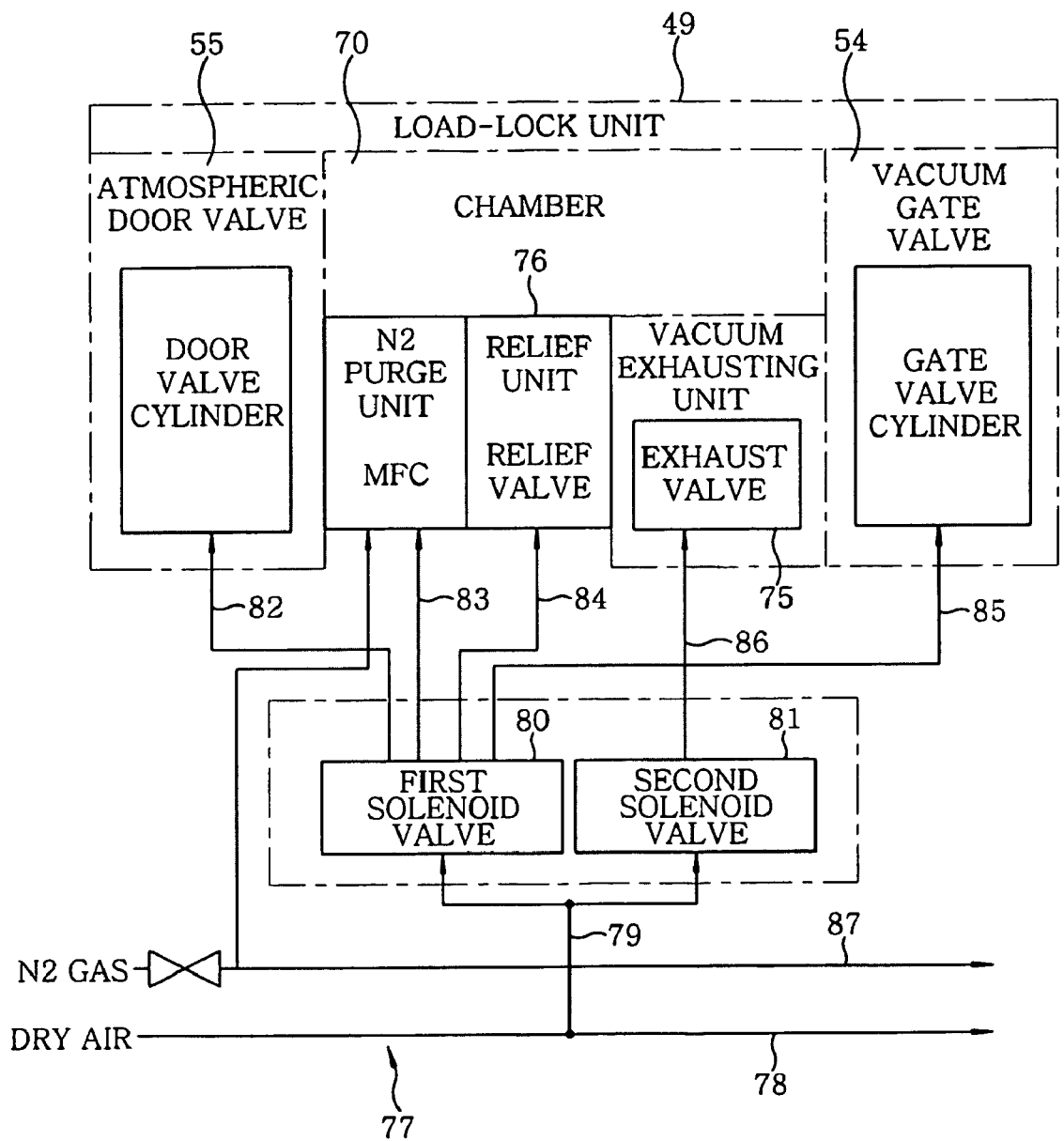
FIG. 5 schematically shows a configuration of a dry air supply system for driving a second load lock unit shown in FIG. 4.

FIG. 5 offers a diagram schematically showing a configuration of a dry air supply system 77 for driving the second load lock unit 49 in FIG. 4.

As shown in FIG. 5, dry air from the dry air supply system 77 for driving the second load lock unit 49 is supplied to a door valve cylinder provided in the atmospheric door valve 55 for driving a sliding door, the MFC provided in the nitrogen gas supply pipe 71 as an N$_2$ purge unit, the relief valve 76 provided in the atmosphere communicating pipe 74 as a relief unit for opening the interior of the chamber 70 to the atmosphere, the exhaust valve 75 provided in the second load lock unit exhaust system 73 as a vacuum exhausting unit, and a gate valve cylinder for driving a sliding gate of the vacuum gate valve 54.

The dry air supply system 77 has an auxiliary dry air supply pipe 79 branches off from a main dry air supply pipe 78 of the second process ship 12, and a first solenoid valve 80 and a second solenoid valve 81 that are connected to the auxiliary dry air supply pipe 79.

The first solenoid valve 80 is connected to the door valve cylinder, the MFC, the relief valve 76, and the gate valve cylinder through dry air supply pipes 82, 83, 84 and 85, respectively, and controls operation of these elements by controlling the amount of dry air supplied thereto. Moreover, the second solenoid valve 81 is connected to the exhaust valve 75 through a dry air supply pipe 86, and controls operation of the exhaust valve 75 by controlling the amount of dry air supplied to the exhaust valve 75. The MFC provided in the nitrogen gas supply pipe 71 is also connected to a nitrogen (N$_2$) gas supply system 87.

Each of the second processing unit 34 and the third processing unit 36 also has a dry air supply system configured similarly to the dry air supply system 77 for driving the second load lock unit 49 described above.

Referring to FIG. 1 again, the substrate processing apparatus 10 has a system controller for controlling operations of the first process ship 11, the second process ship 12, the loader unit 13, and an operation panel 88 disposed at one end of the loader unit 13 in the longitudinal direction of the loader unit 13.

The operation panel 88 has a display unit made of, e.g., an LCD (liquid crystal display), for displaying the state of operation of the components of the substrate processing apparatus 10.

Figure 6:
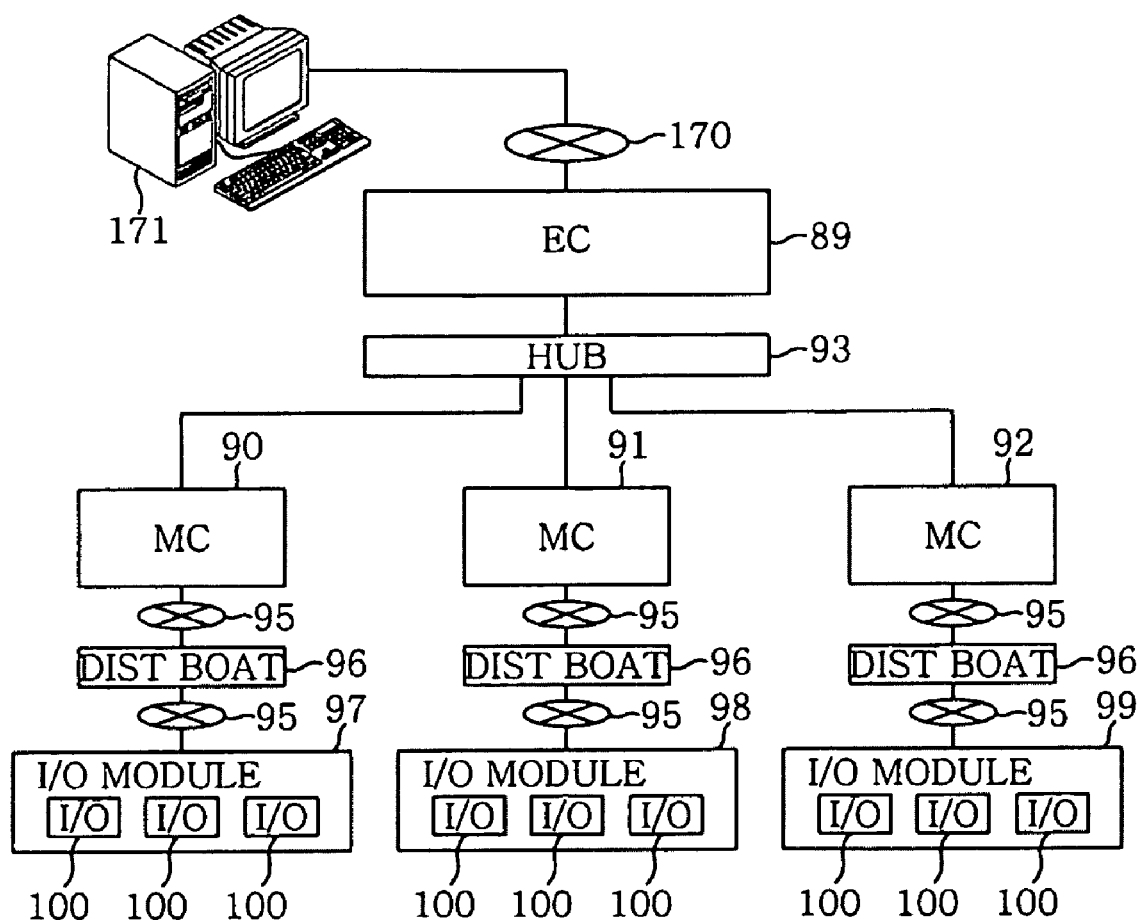
FIG. 6 presents a diagram schematically showing a configuration of a system controller in the substrate processing apparatus in FIG. 1.

Further, as shown in FIG. 6, the system controller has an EC (equipment controller) 89, three MC's (module controllers) 90, 91 and 92, and a switching hub 93 connecting the EC 89 and each of the MC's. The EC 89 of the system controller is connected via a LAN (local area network) 170 to a PC 171 as an MES (manufacturing execution system) for performing overall control of the manufacturing processes in the manufacturing plant where the substrate processing apparatus 10 is installed. The MES and the system controller cooperate together such that a basic operation system (not shown) receives a feedback of real-time data on the processes in the manufacturing plant, and decisions are made in consideration of the processes in view of the overall load on the manufacturing plant and the like.

The EC 89 is a main controller (master controller) for controlling the MC's and carries out overall control of the operation of the substrate processing apparatus 10. The EC 89 has a CPU, a RAM, an HDD and the like. The CPU sends control signals to the MC's in accordance with programs corresponding to wafer W processing methods, i.e. recipes, specified by a user using the operation panel 88, thereby controlling the operations of the first process ship 11, the second process ship 12 and the loader unit 13.

The switching hub 93 switches to select which MC is connected to the EC 89 in accordance with the control signals from the EC 89.

The MC's 90, 91 and 92 are auxiliary controllers (slave controllers) for controlling the operations of the first process ship 11, the second process ship 12 and the loader unit 13, respectively. The MC's are connected to I/O (input/output) modules 97, 98 and 99 through DIST (distribution) boards 96 via a GHOST networks 95, respectively. A GHOST network 95 is a network realized through an LSI known as a GHOST (general high-speed optimum scalable transceiver) on an MC board of the corresponding MC. A maximum of 31 I/O modules can be connected to a GHOST network 95. In the GHOST network 95, the MC is the master, and the I/O modules are slaves.

The I/O module 98 has a plurality of I/O units 100 that are connected to components (hereinafter referred to as "end devices") of the second process ship 12, and transmits control signals to the end devices and output signals from the end devices. Examples of the end devices connected to the I/O units 100 of the I/O module 98 are: the MFC in the ammonia gas supply pipe 57, the MFC in the hydrogen fluoride gas supply pipe 58, the pressure gauge 59, and the APC valve 42 in the second processing unit 34; the nitrogen gas supply unit 192, the ozone gas supply unit 195, the pressure gauge 66, the APC valve 69, the buffer arm 52, and the stage heater 51 in the third processing unit 36; the MFC in the nitrogen gas supply pipe 71, the pressure gauge 72, and the second transfer arm 37 in the second load lock unit 49; and the first solenoid valve 80 and the second solenoid valve 81 in the dry air supply system 77.

Each of the I/O modules 97 and 99 has a similar construction to that of the I/O module 98. Moreover, the connection between the I/O module 97 and the MC 90 for the first process ship 11, and the connection between the I/O module 99 and the MC 92 for the loader unit 13 are constructed similarly to the connection between the I/O module 98 and the MC 91 described above, and therefore the description thereof is omitted.

Each GHOST network 95 is also connected to an I/O board (not shown) for controlling input/output of digital signals, analog signals and serial signals to/from the I/O units 100.

In the substrate processing apparatus 10, when performing the COR processing on a wafer W, the CPU of the EC 89 implements the COR processing in the second processing unit 34 by transmitting control signals to desired end devices via the switching hub 93, the MC 91, the GHOST network 95 and the I/O units 100 of the I/O module 98, in accordance with a program corresponding to a recipe for the COR processing.

Specifically, the CPU transmits control signals to the MFC in the ammonia gas supply pipe 57 and the MFC in the hydrogen fluoride gas supply pipe 58 so as to adjust the volumetric flow rate ratio of the ammonia gas and the hydrogen fluoride gas in the chamber 38 to a desired value, and transmits control signals to the TMP 41 and the APC valve 42 so as to adjust the pressure in the chamber 38 to a desired value. Further, at this time, the pressure gauge 59 transmits the value of the pressure in the chamber 38 to the CPU of the EC 89 in the form of an output signal, and the CPU determines control parameters for the MFC in the ammonia gas supply pipe 57, the MFC in the hydrogen fluoride gas supply pipe 58, the APC valve 42 and the TMP 41 based on the transmitted value of the pressure in the chamber 38.

Moreover, when carrying out the PHT processing on a wafer W, the CPU of the EC 89 implements the PHT processing in the third processing unit 36 by transmitting control signals to desired end devices in accordance with a program corresponding to a recipe for the PHT processing.

Specifically, the CPU transmits control signals to the nitrogen gas supply unit 192 and the APC valve 69 so as to adjust the pressure in the chamber 50 to a desired value, and transmits control signals to the stage heater 51 so as to adjust the temperature of the wafer W to a desired temperature. Moreover, at this time, the pressure gauge 66 transmits the value of the pressure in the chamber 50 to the CPU of the EC 89 in the form of an output signal, and the CPU determines control parameters for the APC valve 69 and the nitrogen gas supply unit 192 based on the transmitted value of the pressure in the chamber 50.

Furthermore, when carrying out the organic material layer removal processing on a wafer W, the CPU of the EC 89 implements the organic material layer removal processing in the third processing unit 36 by transmitting control signals to desired end devices in accordance with a program corresponding to a recipe for the organic material layer removal processing.

Specifically, the CPU transmits control signals to the ozone gas supply unit 195 and the APC valve 69 so as to adjust the pressure in the chamber 50 to a desired value, and transmits control signals to the stage heater 51 so as to adjust the temperature of the wafer W to a desired temperature. At this time, the pressure gauge 66 transmits the value of the pressure in the chamber 50 to the CPU of the EC 89 in the form of an output signal, and the CPU determines control parameters for the APC valve 69 and the ozone gas supply unit 195 based on the transmitted value of the pressure in the chamber 50.

In accordance with the system controller of FIG. 6, the plurality of end devices are not directly connected to the EC 89. Instead, the I/O units 100 connected to the plurality of end devices are modularized to form the I/O modules, and each I/O module is connected to the EC 89 via an MC and the switching hub 93. As a consequence, the communications system can be simplified.

Further, each of the control signals transmitted by the CPU of the EC 89 contains an address of the I/O unit 100 connected to a desired end device and an address of the I/O module containing the corresponding I/O unit 100. Therefore, the switching hub 93 refers to the address of the I/O module in the control signal, and the GHOST of the appropriate MC refers to the address of the I/O unit 100 in the control signal. Accordingly, the need for the switching hub 93 or the MC to ask the CPU for the destination of the control signal can be eliminated and, hence, smoother transmission of the control signals can be realized.

As described earlier, as a result of etching floating gates and an inter-layer $SiO_2$ film on a wafer W, a deposit film including a SiOBr layer, a CF-based deposit layer, and a SiOBr layer is formed on side surfaces of trenches formed in the wafer W. As described above, each SiOBr layer is a pseudo-$SiO_2$ layer having properties similar to those of a $SiO_2$ layer. The SiOBr layers and the CF-based deposit layer cause problems for electronic devices such as conduction failure and hence need to be removed.

In the substrate processing method of the present embodiment, in order to solve the problems described above, the wafer W having the deposit film formed on the side surfaces of the trenches is subjected to COR processing, PHT processing, and organic material layer removal processing.

In the substrate processing method in accordance with the present embodiment, ammonia gas and hydrogen fluoride gas are used in the COR processing. Here, the hydrogen fluoride gas promotes corrosion of the pseudo-$SiO_2$ layer, and the ammonia gas is involved in synthesis of a reaction by-product for restricting, and ultimately stopping, the reaction between the oxide film and the hydrogen fluoride gas as required. Specifically, the following chemical reactions are used in the COR processing and the PHT processing in the substrate processing method of the present embodiment.

(COR processing)

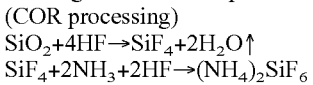

$SiO_2 + 4HF \rightarrow SiF_4 + 2H_2O\uparrow$ $SiF_4 + 2NH_3 + 2HF \rightarrow (NH_4)_2SiF_6$ (PHT processing)

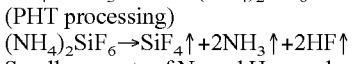

$(NH_4)_2SiF_6 \rightarrow SiF_4\uparrow + 2NH_3\uparrow + 2HF\uparrow$

Small amounts of $N_2$ and $H_2$ are also produced in the PHT processing.

Moreover, in the substrate processing method of the present embodiment, ozone gas is used in the organic material layer removal processing. Here, in a wafer W that has been subjected to the COR processing and the PHT processing, the SiOBr layer as the outermost layer of the deposit film on the side surfaces of the trenches has been removed so as to expose the CF-based deposit layer as an organic material layer. The ozone gas decomposes the exposed CF-based deposit layer. Specifically, the CF-based deposit layer exposed to the ozone gas is decomposed through chemical reaction into CO, $CO_2$, $F_2$ or the like. As a result, the CF-based deposit layer of the deposit film on the side surfaces of the trenches is removed.

Figure 7:
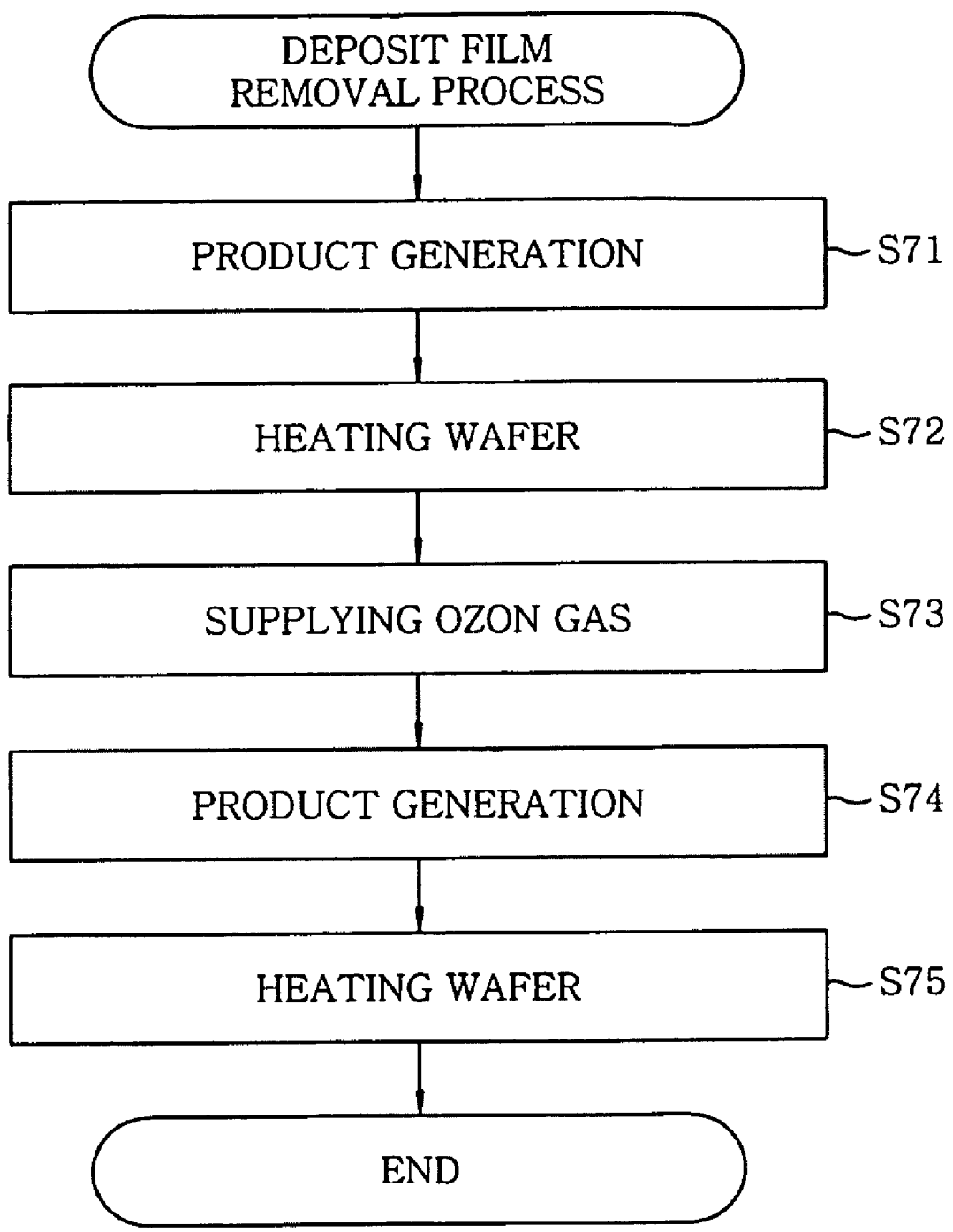
FIG. 7 represents a flowchart of a deposit film removal process as a substrate processing method in accordance with the first embodiment.

FIG. 7 is a flowchart of a deposit film removal process as the substrate processing method of the present embodiment.

As shown in FIG. 7, in the substrate processing apparatus 10, first of all, a wafer W having a deposit film formed of a SiOBr layer, a CF-based deposit layer and a SiOBr layer formed on side surfaces of trenches is accommodated in the chamber 38 of the second processing unit 34. Next, the pressure in the chamber 38 is adjusted to a predetermined pressure. Thereafter, ammonia gas, hydrogen fluoride gas, and argon (Ar) gas as a dilution gas are introduced into the chamber 38 to produce an atmosphere of a mixed gas thereof in the chamber 38, and the outermost SiOBr layer is exposed to the mixed gas under the predetermined pressure. As a result, a product having a complex structure $((NH_4)_2SiF_6)$ is produced through chemical reaction among the SiOBr layer, the ammonia gas, and the hydrogen fluoride gas (step S71) (chemical reaction processing step). Here, the time for allowing the outermost SiOBr layer to be exposed to the mixed gas is preferably about 2 to 3 minutes, and the temperature of the ESC 39 is preferably set between about 10 and 100° C.

The partial pressure of the hydrogen fluoride gas in the chamber 38 is preferably between about 6.7 and 13.3 Pa (50 to 100 mTorr). Accordingly, the flow rate ratio for the mixed gas in the chamber 38 is stable and, hence, generation of the product can be promoted. As the temperature increases, it becomes more difficult for by-products formed in the chamber 38 to be attached to an inner wall of the chamber 38. Accordingly, the temperature of the inner wall of the chamber 38 is preferably set to about 50° C. by using the heater (not shown) embedded in the side wall of the chamber 38.

Next, the wafer W on which the product has been produced is mounted on the stage heater 51 in the chamber 50 of the third processing unit 36, and the pressure in the chamber 50 is adjusted to a predetermined pressure. Then, nitrogen gas is introduced into the chamber 50 to produce viscous flow, and the wafer W is heated to a predetermined temperature by using the stage heater 51 (step S72) (heat treatment step). Here, the complex structure of the product is thermally decomposed, and the product is separated into silicon tetrafluoride ($SiF_4$), ammonia and hydrogen fluoride, which are vaporized. The vaporized gas molecules are entrained in the viscous flow of nitrogen gas supplied through the nitrogen gas supply hole 194, and thus discharged from the chamber 50 by the third processing unit exhaust system 67.

In the third processing unit 36, the product is a complex compound containing coordinate bonds. The complex compound is weakly bonded and thus undergoes thermal decomposition even at a relatively low temperature. Therefore, the predetermined temperature to which the wafer W is heated is preferably about 80 to 200° C., and the time for allowing the wafer W to be subjected to the PHT processing is preferably about 30 to 120 seconds. Further, in order to produce viscous flow in the chamber 50, it is undesirable to increase the degree of vacuum in the chamber 50 so that a gas flow of a certain flow rate is required. Therefore, the predetermined pressure in the chamber 50 is preferably about 6.7×10 to 1.3×10² Pa (500 mTorr to 1 Torr), and the nitrogen gas flow rate is preferably about 500 to 3000 sccm. As a result, viscous flow can be produced reliably in the chamber 50 and, hence, the gas molecules produced through the thermal decomposition of the product can be reliably removed.

Next, an ozone gas is supplied into the chamber 50 of the third processing unit 36 through the ozone gas supply hole 197 (step S73) (ozone gas supplying step). At this time, the supplied ozone gas decomposes the CF-based deposit layer that has been exposed through the removal of the outermost SiOBr layer into gas molecules such as CO, CO2, and F2 through chemical reaction. The gas molecules are entrained in the viscous flow of nitrogen gas supplied through the nitrogen gas supply hole 194, and thus discharged from the chamber 50 by the third processing unit exhaust system 67. Here, the time for allowing the ozone gas to be supplied into the chamber 50 is preferably approximately 10 seconds, and the temperature of the stage heater 51 is preferably set to be within the range of about 100 to 200° C. Further, the flow rate of the ozone gas supplied through the ozone gas supply hole 197 is preferably about 1 to 5 SLM.

Thereafter, the wafer W on which the innermost SiOBr layer has been exposed through the removal of the CF-based deposit layer of the deposit film on the side surfaces of the trenches is accommodated in the chamber 38 of the second processing unit 34, and is subjected to the same processing as in step S71 described above (step S74). Next, the wafer W is mounted on the stage heater 51 in the chamber 50 of the third processing unit 36 so as to be subjected to the same processing as in step S72 described above (step S75). As a result, the innermost SiOBr layer is removed, and the process is terminated.

The step S73 described above corresponds to the organic material layer removal processing.

In accordance with the substrate processing apparatus of the present embodiment described above, the third processing unit 36 has the ozone gas supply system 191 for supplying ozone gas into the chamber 50. For a wafer W in which a CF-based deposit layer covered with an outermost SiOBr layer is formed on side surfaces of its trenches, when a product produced from the SiOBr layer through chemical reaction with ammonia gas and hydrogen fluoride gas is heated, the product is vaporized so as to expose the CF-based deposit layer. The CF-based deposit layer is now exposed to the supplied ozone gas, and the ozone gas decomposes the CF-based deposit layer into gas molecules such as Co, $CO_2$, and $F_2$ through chemical reaction. Accordingly, the CF-based deposit layer can be continuously removed without interruption after the outermost SiOBr layer is removed and, hence, the SiOBr layer and the CF-type deposit layer can be removed efficiently.

Further, in the above substrate processing apparatus, the ozone gas supply hole 197 is arranged opposite to the wafer W mounted on the stage heater 51 and, thus, the ozone gas can be supplied intensively to the surface of the wafer W. As a result, the CF-based deposit layer can be removed more efficiently.

In FIG. 3, the ozone gas supply pipe 196 of the ozone gas supply system 191 is formed of a single pipe. However, the ozone gas supply pipe 196 can be formed of a plurality of pipes without being limited to the above example. In that case, a plurality of ozone gas supply holes is provided to correspond to the plurality of pipes at the ceiling portion of the chamber 50. Here, a part of the ozone gas supply holes can be arranged opposite to a peripheral portion (bevel portion) of the wafer W mounted on the stage heater 51, or heaters can be provided at the pipes corresponding to the ozone gas supply holes provided opposite to the bevel portion. Accordingly, the ozone gas supply holes arranged opposite to the bevel portion can supply high-temperature ozone gas toward the bevel portion. When the deposit attached to the bevel portion (bevel polymer) is exposed to high-temperature ozone gas, the bevel polymer is decomposed through thermal chemical reaction. Therefore, the bevel polymer can be decomposed by supplying high-temperature ozone gas to the bevel portion through the ozone gas supply holes provided opposite to the bevel portion. At this time, if nitrogen gas is supplied from the nitrogen gas supply system 190 into the chamber 50, viscous flow of nitrogen gas is produced, and the bevel polymer is decomposed by the viscous flow. As a consequence, the bevel polymer can be reliably removed from the bevel portion. Further, the stage heater 51 may be provided with lifting pins for lifting the wafer W from the stage heater 51. When the wafer W is lifted by the lifting pins, high-temperature ozone gas can reach a rear surface of the bevel portion of the wafer W. As a result, the bevel polymer attached to the rear surface of the bevel portion can be reliably removed.

Hereinafter, a substrate processing apparatus in accordance with a second embodiment of the present invention will be described.

The configuration and the operation of the present embodiment are substantially the same as those of the aforementioned first embodiment except that an oxygen radical supply system is provided instead of the ozone gas supply system. Therefore, the description of the same configuration and operation will be omitted, and only the difference will be explained hereinafter.

Figure 8:
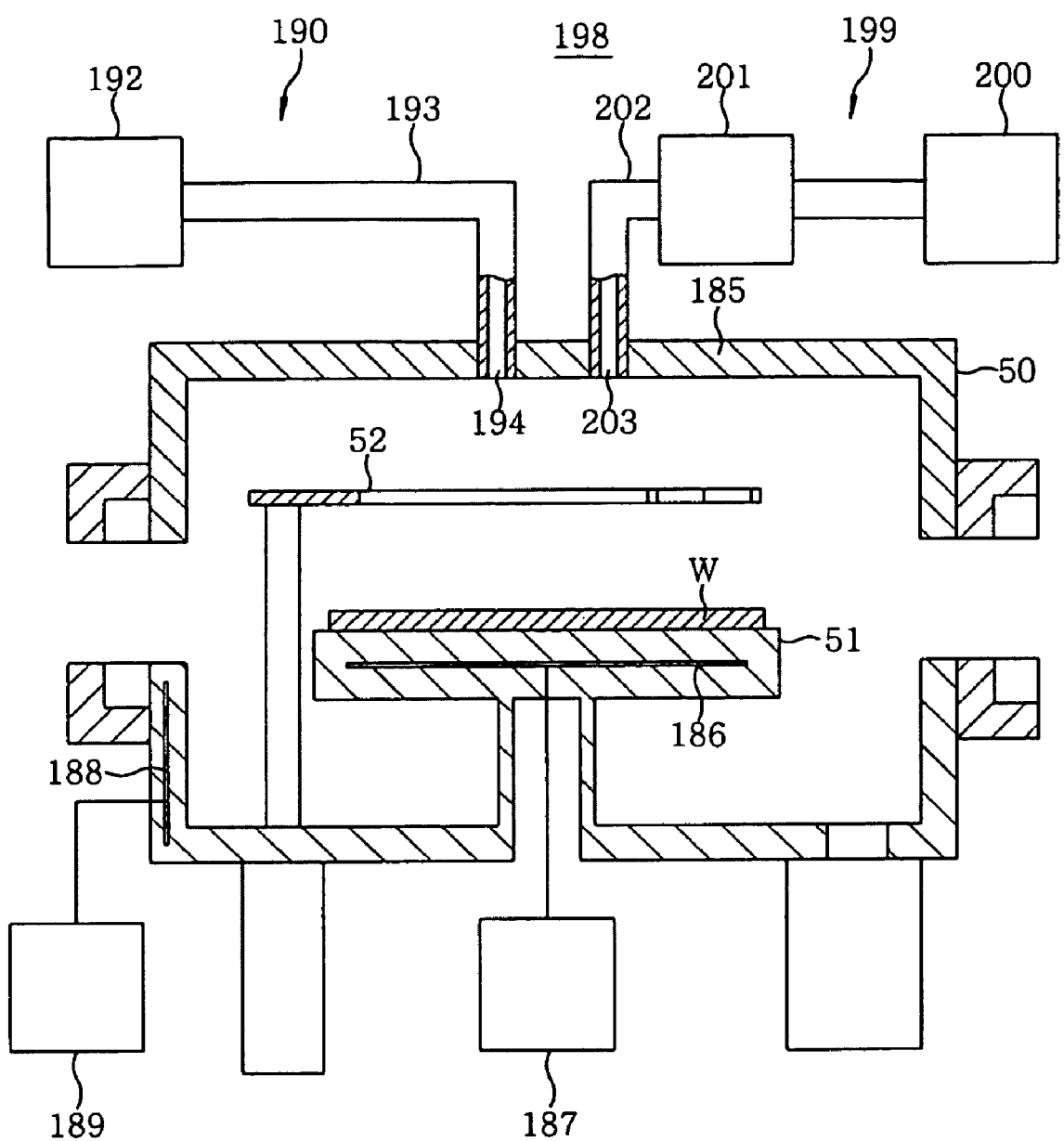
FIG. 8 is a cross sectional view of a third processing unit as a heat treatment unit of a substrate processing apparatus in accordance with a second embodiment of the present invention.

FIG. 8 is a cross sectional view of a third processing unit 198 as a heat treatment unit of a substrate processing apparatus in accordance with the present embodiment.

As shown in FIG. 8, the third processing unit 198 has an oxygen radical supply system 199 instead of the ozone gas supply system.

The oxygen gas supply system 199 has an ozone gas supply unit 200, an ozone gas heating unit 201, and an oxygen radical supply pipe 202 connecting the chamber 50 and the ozone gas supply unit 200 via the ozone gas heating unit 201. The oxygen radical supply pipe 202 has an oxygen radical supply hole 203 having an opening at the ceiling portion of the chamber 50 so as to be disposed opposite to the wafer W mounted on the stage heater 51. The ozone gas supply unit 200 supplies ozone gas into the oxygen radical supply pipe 202, and the ozone gas heating unit 201 thermally decomposes the ozone gas that has been supplied into the oxygen radical supply pipe 202 into oxygen radicals. The oxygen radicals thus produced are supplied into the chamber 50 through the oxygen radical supply hole 203. Moreover, the ozone gas supply unit 200 controls a flow rate of the supplied ozone gas, and further controls a flow rate of the oxygen radicals.

In the third processing unit 198, each wafer W that has been subjected to the PHT processing is subjected to the organic material layer removal processing following on from the PHT processing.

Hereinafter, a substrate processing method in accordance with the present embodiment will be described.

The substrate processing method of the present embodiment is different from that of the first embodiment in that oxygen radicals are used in the organic material layer removal processing. The oxygen radicals decompose the CF-based deposit layer that has been exposed through the COR processing and the PHT processing. Specifically, the CF-based deposit layer exposed to the oxygen radicals is decomposed through chemical reaction into CO, $CO_2$, $F_2$ or the like. As a result, the CF-based deposit layer of the deposit film on the side surfaces of the trenches is removed.

Figure 9:
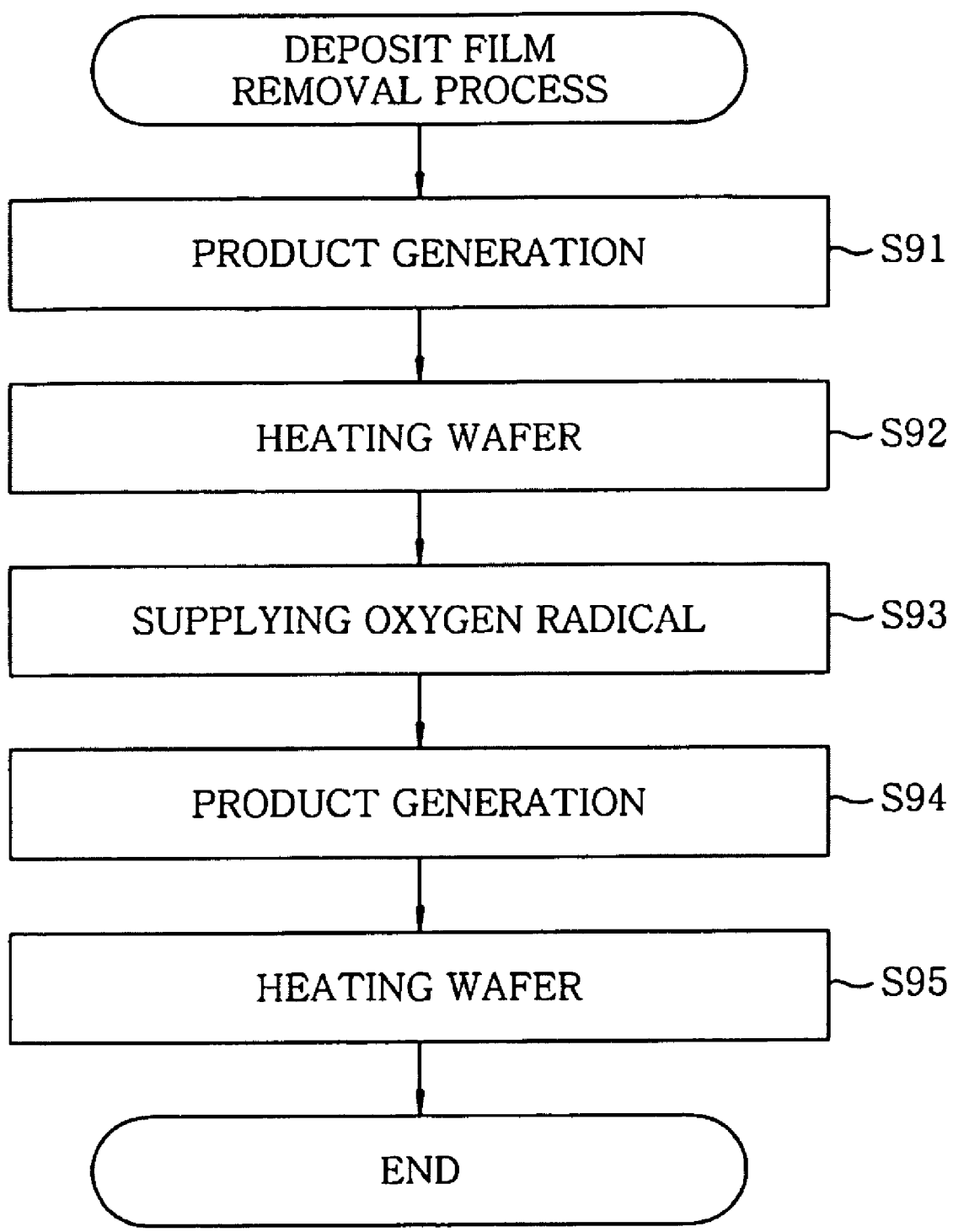
FIG. 9 illustrates a flowchart of a deposit film removal process as a substrate processing method in accordance with the second embodiment.

FIG. 9 illustrates a flowchart of a deposit film removal process as the substrate processing method in accordance with the present embodiment.

As shown in FIG. 9, in the substrate processing apparatus 10, first of all, a wafer W having a deposit film formed of a SiOBr layer, a CF-based deposit layer and a SiOBr layer formed on side surfaces of trenches is accommodated in the chamber 38 of the second processing unit 34, and is subjected to the same processing as in step S71 described in FIG. 7 (step S91). Next, the wafer W is mounted on the stage heater 51 in the chamber 50 of the third processing unit 36 so as to be subjected to the same processing as in step S72 described in FIG. 7 (step S92). As a result, the outermost SiOBr layer is removed, and the CF-based deposit layer is exposed.

Thereafter, oxygen radicals are supplied into the chamber 50 of the third processing unit 36 through the oxygen radical supply hole 203 (step S93) (oxygen radical supplying step). At this time, the supplied oxygen radicals decompose the exposed CF-based deposit layer into gas molecules such as Co, $CO_2$, and $F_2$ through chemical reaction. The gas molecules are entrained in the viscous flow of nitrogen gas supplied through the nitrogen gas supply hole 194, and thus discharged from the chamber 50 by the third processing unit exhaust system 67. Here, the time for allowing the oxygen radicals to be supplied into the chamber 50 is preferably approximately 10 seconds, and the temperature of the stage heater 51 is preferably set to be within the range of about 100 to 200° C. Further, the flow rate of the oxygen radicals supplied through the oxygen radical supply hole 203 is preferably about 1 to 5 SLM.

Next, the wafer W on which the innermost SiOBr layer has been exposed through the removal of the CF-based deposit layer of the deposit film on the side surfaces of the trenches is accommodated in the chamber 38 of the second processing unit 34, and is subjected to the same processing as in step S91 described above (step S94). Thereafter, the wafer W is mounted on the stage heater 51 in the chamber 50 of the third processing unit 36 so as to be subjected to the same processing as in step S92 described above (step S95). As a result, the innermost SiOBr layer is removed and, then, the present process is terminated.

The step S93 described above corresponds to the organic material layer removal processing.

In accordance with the substrate processing apparatus of the present embodiment described above, the third processing unit 198 has the oxygen radical supply system 199 for supplying oxygen radicals into the chamber 50. In a wafer W in which a CF-based deposit layer covered with an outermost SiOBr layer is formed on side surfaces of trenches, when a product produced from the SiOBr layer through chemical reaction with gas molecules is heated, the product is vaporized so that the CF-based deposit layer is exposed. The CF-based deposit layer is now exposed to the supplied oxygen radicals, and the oxygen radicals decompose the CF-based deposit layer. Accordingly, the CF-based deposit layer can thus be removed without interruption after the outermost SiOBr layer is removed and, hence, the SiOBr layer and the CF-based deposit layer can be removed efficiently.

Further, in the aforementioned substrate processing apparatus, the oxygen radical supply hole 203 is disposed opposite to the wafer W mounted on the stage heater 51, so that the oxygen radicals can be supplied intensively to the surface of the wafer W. As a result, the CF-based deposit layer can be removed more efficiently.

Moreover, in the aforementioned substrate processing apparatus, the oxygen radical supply system 199 has the ozone gas supply unit 200 and the ozone gas heating unit 201 for thermally decomposing ozone gas supplied to the chamber 50. The ozone gas is easy to handle and is easily thermally decomposed into oxygen radicals. Therefore, the oxygen radicals are easily supplied so that the CF-based deposit layer can be efficiently and reliably removed.

Although the aforementioned third processing unit 198 is provided with the oxygen radical supply system 199 having the ozone gas supply unit 200 and the ozone gas heating unit 201, the oxygen radical supply system does not necessarily have the ozone gas supply unit and the ozone gas heating unit. The oxygen radical supply system may have an oxygen radical supply unit for supplying oxygen radicals, which is externally generated, into the chamber 50.

The following is a description of a substrate processing apparatus in accordance with a third embodiment of the present invention.

The configuration and the operation of the present embodiment are substantially the same as those of the aforementioned first embodiment except that the oxygen radical supply system is provided instead of the ozone gas supply system. Therefore, the description of the same configuration and operation will be omitted, and only the difference will be explained hereinafter.

A third processing unit of the substrate processing apparatus of the present embodiment is different from the third processing unit 36 in that an oxygen gas supply system and a chlorine gas supply system are provided instead of the ozone gas supply system. Other configurations are the same as those of the third processing unit 36.

The oxygen gas supply system pours out oxygen gas toward the wafer W mounted on the stage heater 51, and the chlorine gas supply system supplies chlorine gas toward the wafer W. Also in the third processing unit of this embodiment, each wafer W that has been subjected to the PHT processing is subjected to the organic material layer removal processing by subsequently following after the PHT processing.

Hereinafter, a substrate processing method in accordance with the present embodiment will be explained.

The substrate processing method of the present embodiment is different from that of the first embodiment in that the supplied oxygen gas ($O_2$-flash) and chlorine gas are used in the organic material layer removal processing. Moreover, when the CF-based deposit layer that has been exposed through the COR processing and the PHT processing is exposed to the oxygen gas and the chlorine gas supplied following on after the oxygen gas, it is decomposed through oxidation reaction and reducing reaction. Accordingly, the CF-based deposit layer of the deposit film on the side surfaces of the trenches is removed.

To be specific, first of all, a wafer W having a deposit film formed of a SiOBr layer, a CF-based deposit layer and a SiOBr layer formed on side surfaces of trenches is subjected to the same processing as in steps S71 and S72 described in FIG. 7. As a consequence, the innermost SiOBr layer is removed, and the CF-based deposit layer is exposed.

Next, oxygen gas is poured out from the oxygen gas supply system into the chamber 50 of the third processing unit. At this time, the CF-based deposit layer is oxidized. After the CF-based deposit layer is oxidized, chlorine gas is supplied from the chlorine gas supply system. Accordingly, the oxidized CF-based deposit layer is reduced and ultimately decomposed. As a result, the CF-based deposit layer of the deposit film on the side surfaces of the trenches is removed.

After removing the CF-based deposit layer of the deposit film on the side surfaces of the trenches, the innermost SiOBr layer is exposed on the wafer W. The wafer W on which the innermost SiOBr layer has been exposed is subjected to the same processing as in steps S71 and S72. As a result, the innermost SiOBr layer is removed and, then, the present process is terminated.

In accordance with the substrate processing apparatus of the present embodiment described above, the third processing unit has the oxygen gas supply system for pouring out oxygen gas toward the wafer W and the chlorine gas supply system for supplying chlorine gas toward the wafer W. In a wafer W having formed on side surfaces of trenches therein a CF-based deposit layer covered with an outermost SiOBr layer, when a product produced from the SiOBr layer through chemical reaction with gas molecules is heated, the product is vaporized so that the CF-based deposit layer is exposed. When the CF-based deposit layer that has been exposed through the COR processing and the PHT processing is exposed to the oxygen gas and the chlorine gas subsequently supplied after the oxygen gas, it is decomposed through oxidation reaction and reducing reaction. Accordingly, the CF-based deposit layer can be continuously removed without interruption after the SiOBr layer is removed and, hence, the SiOBr layer and the CF-based deposit layer can be removed efficiently.

The substrate processing apparatus in accordance with the embodiment described above is not limited to a parallel-type substrate processing apparatus in which two process ships are arranged in parallel with each other as shown in FIG. 1. As can be seen from FIG. 10 or 11, the substrate processing apparatus may be one having a plurality of processing units arranged in a radial shape as vacuum processing chambers for performing predetermined processing on the wafers W.

Figure 10:
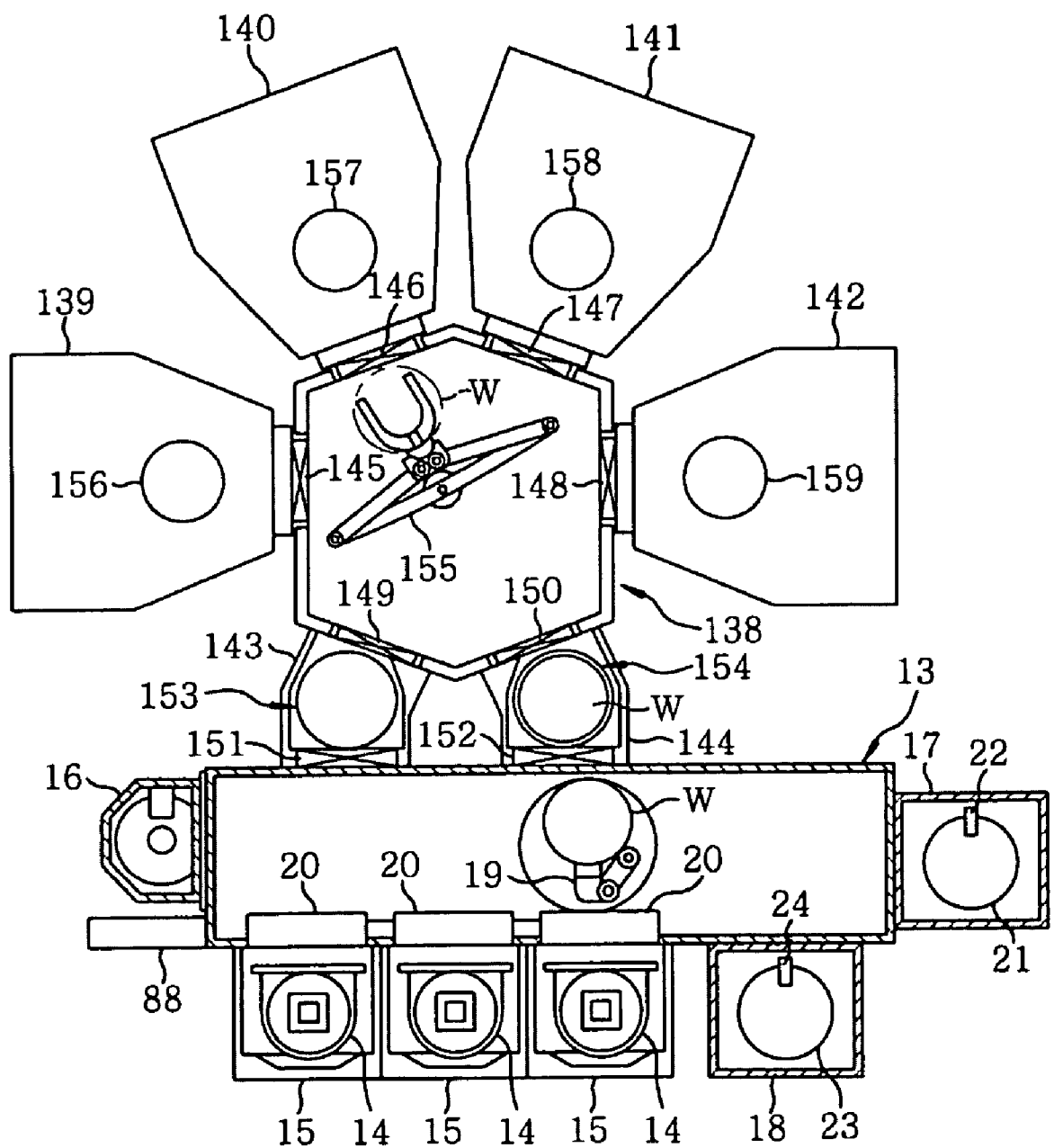
FIG. 10 offers a top view schematically showing a configuration of a first modification of the substrate processing apparatus in accordance with the first and second embodiments.

FIG. 10 is a top view schematically showing a configuration of a first modification of the substrate processing apparatus in accordance with the embodiment described above. In FIG. 10, like reference numerals will be used for like parts identical to those of the substrate processing apparatus 10 shown in FIG. 1, and redundant description thereof will be omitted.

As illustrated in FIG. 10, a substrate processing apparatus 137 has a transfer unit 138 having a hexagonal shape in top view, four processing units 139 to 142 arranged in a radial shape around the transfer unit 138, a loader unit 13, and two load lock units 143 and 144 disposed between the transfer unit 138 and the loader unit 13 so as to connect the transfer unit 138 and the loader unit 13.

The internal pressure of the transfer unit 138 and each of the processing units 139 to 142 is held at vacuum. The transfer unit 138 is connected to the processing units 139 to 142 by vacuum gate valves 145 to 148, respectively.

In the substrate processing apparatus 137, the internal pressure of the transfer unit 138 is held at vacuum, whereas the internal pressure of the loader unit 13 is held at the atmospheric pressure. Therefore, the load lock units 143 and 144 are provided respectively with a vacuum gate valve 149 and 150 in a connecting part between that load lock unit and the transfer unit 138, and an atmospheric door valve 151 and 152 in a connecting part between that load lock unit and the loader unit 13. Accordingly, the load lock units 143 and 144 are constructed as a preliminary vacuum transfer chamber whose internal pressure can be adjusted. Moreover, the load lock units 143 and 144 have respectively therein a wafer mounting tables 153 and 154 for temporarily mounting thereon a wafer W transferred between the loader unit 13 and the transfer unit 138.

The transfer unit 138 has therein a frog-leg type transfer arm 155 capable of contracting, extending and revolving. The transfer arm 155 transfers the wafers W between the processing units 139 to 142 and the load lock units 143 and 144.

The processing units 139 to 142 have respective mounting tables 156 to 159 for mounting thereon a wafer W to be processed. Here, the processing units 139 and 140 are constructed like the first processing unit 25 in the substrate processing apparatus 10; the processing unit 141 is constructed like the second processing unit 34; and the processing unit 142 is constructed like the third processing unit 36 or 198. Thus, each of the wafers W can be subjected to etching in the processing unit 139 or 140, the COR processing in the processing unit 141 and the PHT processing and the organic material layer removal processing in the processing unit 142.

The substrate processing apparatus 137 implements the substrate processing method in accordance with the embodiment described above by transferring into the processing unit 141 a wafer W having a deposit film formed of a SiOBr layer, a CF-based deposit layer and a SiOBr layer formed on side surfaces of trenches and performing the COR processing, and then transferring the wafer W into the processing unit 142 and performing the PHT processing and the organic material layer removal processing.

Operation of the component elements in the substrate processing apparatus 137 is controlled by using a system controller constructed like the system controller in the substrate processing apparatus 10.

Figure 11:
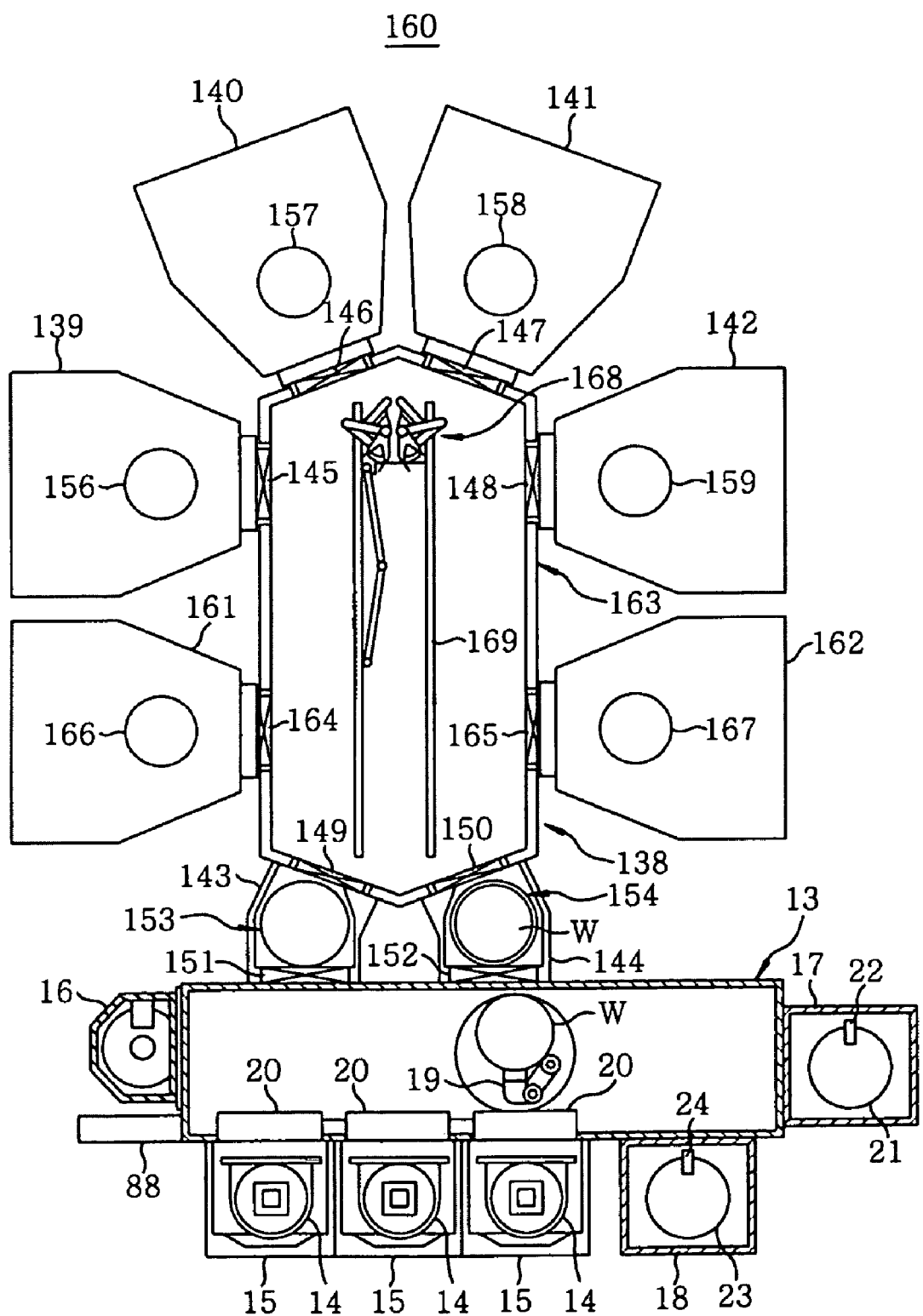
FIG. 11 shows a top view schematically showing a configuration of a second modification of the substrate processing apparatus in accordance with the first and second embodiments.
Figure 12:
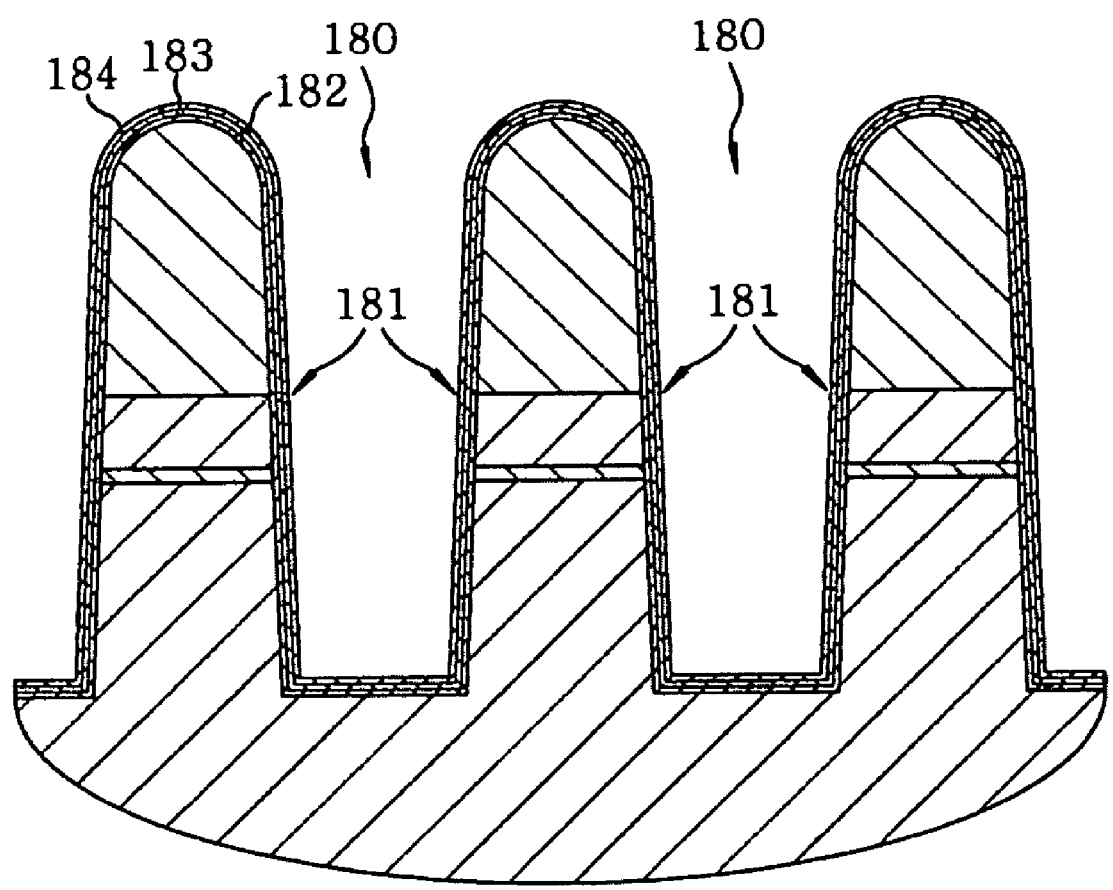
FIG. 12 sets forth a cross sectional view showing a deposit film formed of a SiOBr layer, a CF-based deposit layer and a SiOBr layer.

FIG. 11 is a top view schematically showing a configuration of a second modification of the substrate processing apparatus in accordance with the embodiment described above. In FIG. 11, like reference numerals will be used for like parts identical to those of the substrate processing apparatus 10 of FIG. 1 and the substrate processing apparatus 137 of FIG. 10, and redundant description thereof will be omitted.

As depicted in FIG. 11, compared with the substrate processing apparatus 137 of FIG. 10, the substrate processing apparatus 160 has additional two processing units 161 and 162 and, also, the shape of a transfer unit 163 of the substrate processing apparatus 160 is different from that of the transfer unit 138 of the substrate processing apparatus 137. The additional two processing units 161 and 162 are connected to the transfer unit 163 via vacuum gate valves 164 and 165, and have wafer W mounting tables 166 and 167, respectively. The processing unit 161 is constructed like the first processing unit 25, and the processing unit 162 is constructed like the second processing unit 34.

Further, the transfer unit 163 has a transfer arm unit 168 formed of two scalar-type transfer arms. The transfer arm unit 168 moves along guide rails 169 provided in the transfer unit 163, and transfers the wafers W between the processing units 139 to 142, 161 and 162, and the load lock units 143 and 144.

In the substrate processing apparatus 160, as in the substrate processing apparatus 137, the substrate processing method in accordance with the embodiment described above is implemented by transferring into the processing unit 141 or the processing unit 162 wafer W having a deposit film formed of a SiOBr layer, a CF-based deposit layer and a SiOBr layer formed on side surfaces of trenches and carrying out the COR processing, and then transferring the wafer W into the processing unit 142 and carrying out the PHT processing and the organic material layer removal processing.

Operation of the component elements in the substrate processing apparatus 160 is controlled by using a system controller constructed like the system controller in the substrate processing apparatus 10.

It is to be understood that the object of the present invention can also be attained by supplying to the EC 89 a storage medium in which a program code of software that realizes the functions of each of the embodiments described above is stored, and then causing a computer (or CPU, MPU, or the like) of the EC 89 to read out and execute the program code stored in the storage medium.

In this case, the program code itself read out from the storage medium realizes the functions of each of the embodiments described above and, hence, the program code and the storage medium in which the program code is stored are included in the present invention.

Moreover, the storage medium for supplying the program code may be, e.g., a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a non-volatile memory card, or a ROM. Alternatively, the program code may be downloaded via a network.

Besides, it is to be understood that the functions of each of the embodiments described above may be accomplished not only by executing a program code read out by a computer, but also by causing an OS (operating system) or the like that operates on the computer to perform a part or all of the actual operations based on instructions of the program code.

Furthermore, it is to be understood that the functions of each of the embodiments described above may also be accomplished by writing a program code read out from the storage medium into a memory provided on an expansion board inserted into a computer or in an expansion unit connected to the computer, and then causing a CPU or the like provided on the expansion board or in the expansion unit to perform a part or all of the actual operations based on instructions of the program code.

The form of the program code may be, e.g., object code, program code executed by an interpreter, script data supplied to an OS or the like.

INDUSTRIAL APPLICABILITY

In accordance with the substrate processing apparatus of the present invention, the heat treatment unit includes an ozone gas supply system for supplying ozone gas into the chamber accommodating a substrate. In a substrate having on a surface thereof an organic material layer covered with an oxide layer, when a product produced from the oxide layer through chemical reaction with gas molecules is heated, the product is vaporized so as to expose the organic material layer. The organic material layer is now exposed to the supplied ozone gas, and the ozone gas decomposes the organic material layer. Accordingly, the organic material layer can be continuously removed without interruption after the oxide layer is removed and, hence, the oxide layer and the organic material layer can be removed efficiently.

In accordance with the substrate processing apparatus of the present invention, the ozone gas supply hole of the ozone gas supply system is disposed opposite to the substrate accommodated in the chamber. Therefore, the ozone gas can be supplied intensively to the surface of the substrate and, hence, the organic material layer can be removed more efficiently.

In accordance with the substrate processing apparatus of the present invention, the organic material layer is a layer made of CF-based deposit. The CF-based deposit is easily decomposed by the ozone gas, so that the organic material layer can be removed more efficiently.

In accordance with the substrate processing apparatus of the present invention, the heat treatment unit has an oxygen radical supply system for supplying oxygen radical into the chamber accommodating a substrate. In a substrate having on a surface thereof an organic material layer covered with an oxide layer, when a product produced from the oxide layer through chemical reaction with gas molecules is heated, the product is vaporized so as to expose the organic material layer. The organic material layer is now exposed to the supplied oxygen radicals, and the oxygen radicals decompose the organic material layer. Accordingly, the organic material layer can be continuously removed without interruption after the oxide layer is removed and, hence, the oxide layer and the organic material layer can be removed efficiently.

In accordance with the substrate processing apparatus of the present invention, the oxygen radical supply hole of the oxygen radical supply system is disposed opposite to the substrate accommodated in the chamber. Therefore, the oxygen radicals can be supplied intensively to the surface of the substrate and, hence, the organic material layer can be removed more efficiently.

In accordance with the substrate processing apparatus of the present invention, the oxygen radical supply system has the ozone gas supply unit for supplying ozone gas into the chamber and the ozone gas heating unit for decomposing the supplied ozone gas. The ozone gas is easy to handle and easily thermally decomposed into oxygen radicals. Therefore, the oxygen radicals are simply supplied so that the organic material layer can be reliably and efficiently removed.

In accordance with the substrate processing apparatus of the present invention, the organic material layer is a layer made of CF-based deposit. The CF-based deposit is easily decomposed by the ozone gas, so that the organic material layer can be removed more efficiently.

In accordance with the substrate processing method and the storage medium of the present invention, in a substrate having on a surface thereof an organic material layer covered with an oxide layer, a product is produced through chemical reaction between the oxide layer and gas molecules, and the substrate on which a product has been produced on a surface thereof is heated, so that ozone gas is supplied to the surface of the substrate that has been subjected to heat treatment. When the product produced from the oxide layer through the chemical reaction with the gas molecules is heated, the product is vaporized so as to expose the organic material layer. The organic material layer is now exposed to the supplied ozone gas, and the ozone gas decomposes the organic material layer. Accordingly, the organic material layer can be removed continuously without interruption after the oxide layer is removed and, hence, the oxide layer and the organic material layer can be removed efficiently.

In accordance with the substrate processing method and the storage medium of the present invention, in a substrate having on a surface thereof an organic material layer covered with an oxide layer, a product is produced through chemical reaction between the oxide layer and gas molecules, and the substrate on which a product has been produced on a surface thereof is heated, so that oxygen radicals are supplied to the surface of the substrate that has been subjected to heat treatment. When the product produced from the oxide layer through the chemical reaction with the gas molecules is heated, the product is vaporized so as to expose the organic material layer. The organic material layer is now exposed to the supplied oxygen radicals, and the oxygen radicals decompose the organic material layer. Accordingly, the organic material layer can be continuously removed without interruption after the oxide layer is removed and, hence, the oxide layer and the organic material layer can be removed efficiently.

What is claimed is:

1. A substrate processing method for performing processing on a substrate having on a surface thereof an organic material layer covered with an oxide layer, the substrate processing method comprising:
    a chemical reaction processing step of subjecting the oxide layer to chemical reaction with a process gas so as to produce a product on the surface of the substrate;
    a heat treatment step of heating the substrate on the surface of which the product has been produced; and
    an oxygen radical supply step of supplying oxygen radicals to the surface of the substrate on which the heat treatment has been carried out to decompose the organic material layer via the oxygen radicals,
    wherein the organic material layer includes a CF-based deposit composed of carbon and fluorine.

2. The substrate processing method of claim 1, wherein the oxide layer includes SiOBr, and
    wherein in the chemical reaction processing step, the product is produced through the chemical reaction among SiOBr and molecules of the process gas.

3. The substrate processing method of claim 1, wherein the process gas includes ammonia gas and hydrogen fluoride gas.

4. The substrate processing method of claim 2, wherein the product includes $(NH_4)_2SiF_6$.

5. The substrate processing method of claim 3, wherein in the chemical reaction processing step, partial pressure of the hydrogen fluoride gas in a processing chamber ranges from 6.7 to 13.3 Pa.

6. The substrate processing method of claim 1, wherein in the chemical reaction processing step, time for exposing the oxide layer to the process gas is between 2 to 3 minutes.

7. The substrate processing method of claim 1, wherein in the chemical reaction processing step, the temperature of the substrate is set to be within the range from 10 to 100° C.

8. The substrate processing method of clam 1, wherein the chemical reaction processing step includes heating an inner wall of a processing chamber at a temperature suitable for preventing the product from being attached to the inner wall.

9. The substrate processing method of claim 1, wherein the heat treatment step includes producing viscous flow of a carrier gas in a processing chamber, and discharging substances separated from the product by the viscous flow.

10. The substrate processing method of claim 9, wherein the carrier gas includes nitrogen gas.

11. The substrate processing method of claim 9, wherein the flow rate of the carrier gas ranges from 500 to 3,000 sccm.

12. The substrate processing method of claim 1, wherein in the heat treatment step, the temperature of the substrate ranges from 80 to 200° C.

13. The substrate processing method of claim 1, wherein in the heat treatment step, the pressure in a processing chamber ranges from $6.7 \times 10$ to $1.3 \times 10^2$ Pa.

14. The substrate processing method of claim 1, wherein in the oxygen radical supply step, the flow rate of the oxygen radicals ranges from 1 to 5 SLM.

15. The substrate processing method of claim 1, wherein in the oxygen radical supply step, the temperature of the substrate is set to be within the range from 100 to 200° C.

16. The substrate processing method of claim 1, wherein the oxygen radical supply step includes producing viscous flow of a carrier gas in a processing chamber, and discharging substances separated from the organic material layer by the viscous flow.

17. The substrate processing method of claim 16, wherein the carrier gas includes nitrogen gas.

18. The substrate processing method of claim 1, wherein at least a part of the oxygen radicals are supplied from an oxygen radical supply hole disposed opposite to the surface of the substrate.

19. The substrate processing method of claim 1, wherein the oxygen radical supply step includes lifting the substrate from a mounting table supporting the substrate.

20. The substrate processing method of claim 1, wherein at least a part of the oxygen radicals are supplied from an oxygen radical supply hole disposed opposite to a bevel portion of the substrate.

* * * * *

UNITED STATES PATENT AND TRADEMARK OFFICE
CERTIFICATE OF CORRECTION

PATENT NO. : 7,736,942 B2 Page 1 of 1
APPLICATION NO. : 12/191041
DATED : June 15, 2010
INVENTOR(S) : Eiichi Nishimura et al.

It is certified that error appears in the above-identified patent and that said Letters Patent is hereby corrected as shown below:

Column 22, line 10, "claim 2," should read --claim 1,--

Signed and Sealed this

Fifth Day of October, 2010

David J. Kappos
*Director of the United States Patent and Trademark Office*